US012622262B2

(12) United States Patent
Shen et al.

(10) Patent No.: US 12,622,262 B2
(45) Date of Patent: May 5, 2026

(54) LOW-STRESS PASSIVATION LAYER

(71) Applicant: Taiwan Semiconductor Manufacturing Company, Ltd., Hsinchu (TW)

(72) Inventors: Hsiang-Ku Shen, Hsinchu City (TW); Chen-Chiu Huang, Taichung City (TW); Chia-Nan Lin, Chiayi County (TW); Man-Yun Wu, Hsinchu (TW); Wen-Tzu Chen, Taoyuan City (TW); Sean Yang, New Taipei City (TW); Dian-Hao Chen, Hsinchu (TW); Chi-Hao Chang, Taoyuan (TW); Ching-Wei Lin, Hsinchu City (TW); Wen-Ling Chang, Miaoli County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 454 days.

(21) Appl. No.: 18/153,912

(22) Filed: Jan. 12, 2023

(65) Prior Publication Data

US 2024/0136291 A1 Apr. 25, 2024

Related U.S. Application Data

(60) Provisional application No. 63/380,688, filed on Oct. 24, 2022.

(51) Int. Cl.
H01L 23/532 (2006.01)
H01L 21/02 (2006.01)
(Continued)

(52) U.S. Cl.
CPC .. H01L 23/53295 (2013.01); H01L 21/02274 (2013.01); H01L 21/31116 (2013.01);
(Continued)

(58) Field of Classification Search
CPC ........... H01L 23/53295; H01L 23/5226; H01L 21/02274; H01L 21/31116;
(Continued)

(56) References Cited

U.S. PATENT DOCUMENTS 8,802,504 B1 8/2014 Hou et al.
8,803,292 B2 8/2014 Chen et al.
(Continued)

FOREIGN PATENT DOCUMENTS

TW 202006796 A 2/2020
TW 202101775 A 1/2021
TW 202218081 A 5/2022

*Primary Examiner* — Christine A Enad
(74) *Attorney, Agent, or Firm* — Haynes and Boone, LLP

(57) ABSTRACT

Semiconductor devices and methods of forming the same are provided. In some embodiments, a method includes receiving a workpiece having a redistribution layer disposed over and electrically coupled to an interconnect structure. In some embodiments, the method further includes patterning the redistribution layer to form a recess between and separating a first conductive feature and a second conductive feature of the redistribution layer, where corners of the first conductive feature and the second conductive feature are defined adjacent to and on either side of the recess. The method further includes depositing a first dielectric layer over the first conductive feature, the second conductive feature, and within the recess. The method further includes depositing a nitride layer over the first dielectric layer. In some examples, the method further includes removing portions of the nitride layer disposed over the corners of the first conductive feature and the second conductive feature.

20 Claims, 24 Drawing Sheets

(51) Int. Cl.

| | |
|---|---|
| *H01L 21/311* | (2006.01) |
| *H01L 21/3213* | (2006.01) |
| *H01L 21/768* | (2006.01) |
| *H01L 23/00* | (2006.01) |
| *H01L 23/522* | (2006.01) |

(52) U.S. Cl.
CPC .. *H01L 21/32138* (2013.01); *H01L 21/76832* (2013.01); *H01L 21/76837* (2013.01); *H01L 21/76892* (2013.01); *H01L 23/5226* (2013.01); *H01L 24/08* (2013.01); *H01L 24/80* (2013.01); *H01L 2224/08145* (2013.01); *H01L 2224/80895* (2013.01); *H01L 2224/80896* (2013.01)

(58) Field of Classification Search
CPC ......... H01L 21/32138; H01L 21/76832; H01L 21/76837; H01L 21/76892
See application file for complete search history.

(56) References Cited

U.S. PATENT DOCUMENTS

| | | | |
|---|---|---|---|
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 2016/0379946 A1 | 12/2016 | Maekawa et al. | |
| 2021/0098400 A1 | 4/2021 | Shen et al. | |
| 2021/0118783 A1* | 4/2021 | Shen ................. H01L 23/53233 | |
| 2021/0375748 A1 | 12/2021 | Huang et al. | |
| 2022/0310903 A1* | 9/2022 | Huang .................. H10N 50/80 | |
| 2023/0197776 A1* | 6/2023 | Mun ................. H01L 23/53295 | |
| | | | 257/506 |

\* cited by examiner

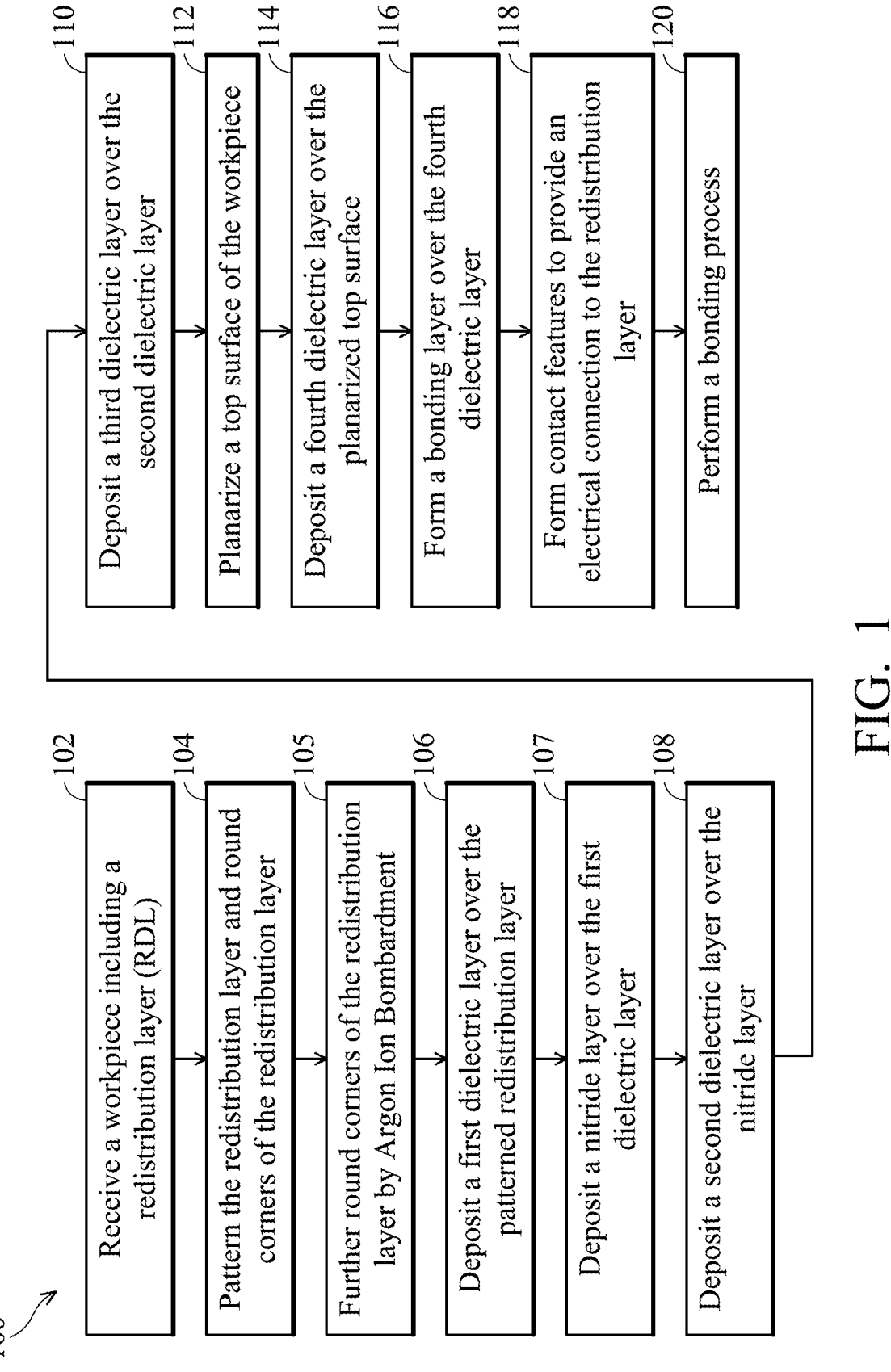

102 — Receive a workpiece including a redistribution layer (RDL)

104 — Pattern the redistribution layer and round corners of the redistribution layer 105 — Further round corners of the redistribution layer by Argon Ion Bombardment 106 — Deposit a first dielectric layer over the patterned redistribution layer 107 — Deposit a nitride layer over the first dielectric layer 108 — Deposit a second dielectric layer over the nitride layer 110 — Deposit a third dielectric layer over the second dielectric layer 112 — Planarize a top surface of the workpiece 114 — Deposit a fourth dielectric layer over the planarized top surface 116 — Form a bonding layer over the fourth dielectric layer 118 — Form contact features to provide an electrical connection to the redistribution layer 120 — Perform a bonding process

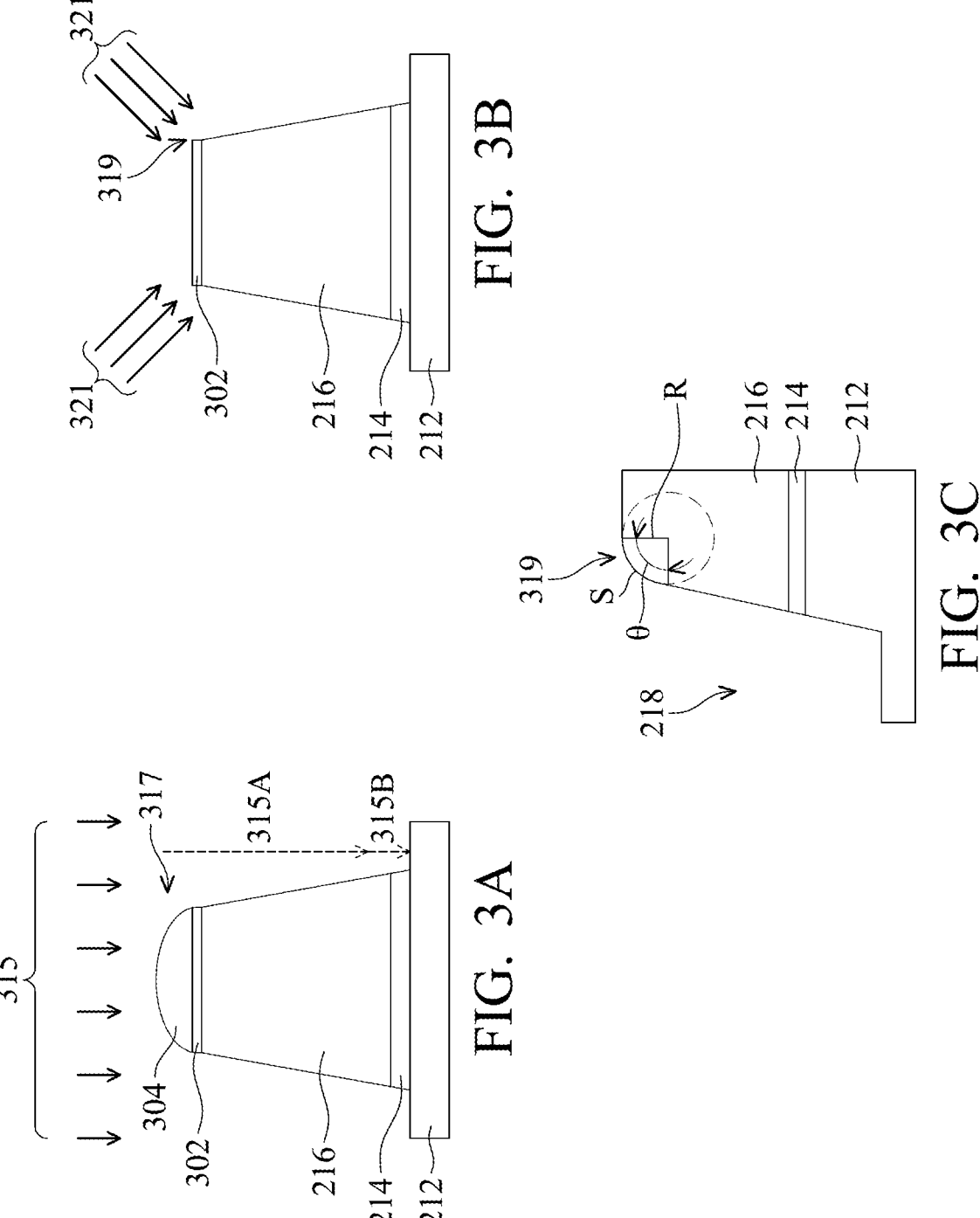

200

227
220
216
212
210
208
2082
2081
206
202

214

204

Z
Y
X

LOW-STRESS PASSIVATION LAYER

CROSS-REFERENCE TO RELATED APPLICATION

This application claims the benefit of U.S. Provisional Application No. 63/380,688, filed Oct. 24, 2022, the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

For example, ICs are formed on a semiconductor substrate that may be cut into individual device dies or IC chips. Each IC chip may be further attached (such as by bonding) to an interposer, a reconstituted wafer, a circuit board, or another die to form a package or a device. To meet various routing needs, a redistribution layer (RDL) of conductive metal lines may be formed on an IC chip to reroute bond connections from the edge to the center of the chip, or generally to disperse bond connections to an area greater than that of the IC chip. One or more passivation layers are implemented around the RDL to protect the semiconductor surface from electrical shorts, stress, and chemical contaminants. However, some passivation layers are prone to stress and cracks during subsequent annealing processes and may lead to voids or cracks between adjacent metal contacts. Therefore, although existing passivation layers and the fabrication thereof have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 1 is a flow chart of a method for fabricating a semiconductor device in accordance with embodiments of the present disclosure;

FIGS. 3A and 3B provide cross-sectional views of a portion of the workpiece during patterning of a redistribution layer, according to some embodiments;

FIGS. 3C and 3D provide enlarged views of a portion of the workpiece illustrated in FIG. 3 after the redistribution layer is patterned, in accordance with some embodiments;

DETAILED DESCRIPTION

Figure 2:
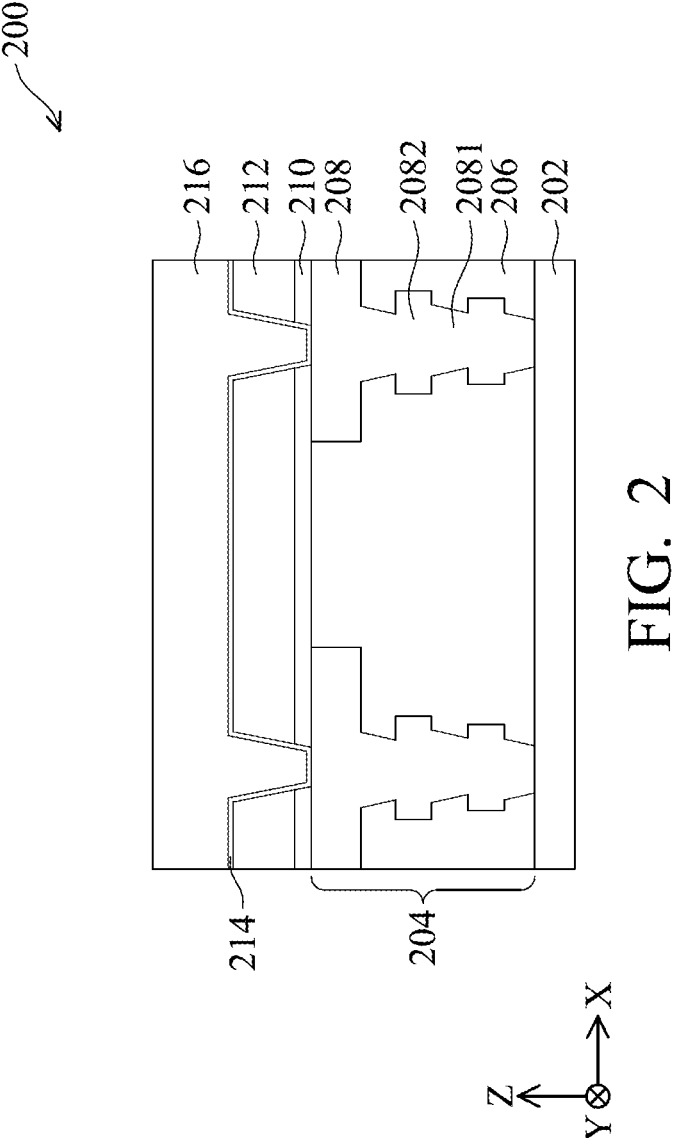
FIGS. 2, 3, 4, 5, 6, 7, 8, 9, 10, 11, 12, and 13 are cross-sectional views of a workpiece at various stages of fabrication according to the method of FIG. 1, in accordance with some embodiments.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described, or other values as understood by person skilled in the art. For example, the term "about 5 nm" encompasses the dimension range from 4.5 nm to 5.5 nm.

On many IC chips, a redistribution layer (RDL) of conductive metal lines is formed to reroute bond connections from the edge to the center of the chip or generally to distribute bond connections to an area larger than that of the IC chip. One or more passivation layers, which are formed of various dielectric layers, may be formed around the RDL to provide protection against electrical shorts, mechanical stresses, and chemical contaminants. By way of example, an RDL may be formed over a first passivation layer, and a second passivation layer may be formed over the RDL and over the first passivation layer. In some instances, a coefficient of thermal expansion (CTE) of the RDL, which is a metal layer, is much greater than that of the surrounding first and second passivation layers. Further, the one or more passivation layers may include a nitride layer (e.g., such as SiN), which has a high Young's modulus. As a result, when the RDL expands or contracts during subsequent annealing processes, the nitride layer of the one or more passivation layers may constrain the RDL and cause residual stress to be exerted from the RDL onto the one or more passivation layers. In some examples, such stress may be concentrated at locations where the device topography is not planar, such as at corners near an interface between the RDL and a passivation layer (e.g., such as at corners where the second passivation layer is formed over the RDL). Concentrated stress at those corners may propagate from the RDL through the one or more passivation layers, thus degrading device reliability.

Embodiments of the present disclosure offer advantages over the existing art, though it is understood that other embodiments may offer different advantages, not all advantages are necessarily discussed herein, and no particular advantage is required for all embodiments. For example, embodiments discussed herein include a semiconductor device with a multi-layer passivation structure and methods of making the same to address the issues described above. In some embodiments, after patterning the RDL, a corner rounding process may be performed to release stress from RDL corners, where stress may be concentrated. The corner rounding process may include a main etching step (with at least some over-etching), followed by an argon (Ar) bombardment step. In some examples, the main etching step is performed using chlorine gas ($Cl_2$) and boron trichloride gas ($BCl_3$), where a $Cl_2/BCl_3$ gas ratio is less than about 2. The Ar bombardment step may be performed for about 10-30 seconds, depending on a pattern density (PD) of the RDL. In some embodiments, the corner rounding process may be further tuned by modulating the deposition rate of the RDL, after which the etching and Ar bombardment steps are performed. In some examples, a dielectric deposition and etching process may be performed to chop portions of the second passivation layer, which may include a nitride layer, at corners where the second passivation layer is formed over the RDL to further release stress from RDL corners. In a further embodiment, the second passivation layer may be formed such that a portion of the second passivation layer that includes a nitride layer is only formed over a top surface the RDL and not over sidewalls of the RDL. As a result, constraint on the RDL by the nitride layer will be significantly reduced and residual stress from the RDL will be released. In some cases, this may also help to reduce formation of voids in the RDL. By implementation of one or more of the above processes to reduce residual RDL stress, cracks in the passivation layers can be avoided, thereby enhancing device yield and reliability, and improving subsequent die-to-die stacking processes. Other embodiments and advantages will be evident to those skilled in the art upon reading the present disclosure.

The various aspects of the present disclosure will now be described in more detail with reference to the figures. In that regard, FIG. 1 provides a flowchart illustrating a method 100 for fabricating a semiconductor device according to embodiments of the present disclosure. The method 100 is merely an example and is not intended to limit the present disclosure to what is explicitly illustrated in the method 100. Additional steps can be provided before, during, and after the method 100, and some steps described can be replaced, eliminated, or moved around for additional embodiments of the method. Not all steps are described herein in detail for reasons of simplicity. The method 100 is described below in conjunction with FIGS. 2-13, which provide cross-sectional views of a workpiece 200 at different stages of fabrication according to embodiments of the present disclosure. As the workpiece 200 is to become or include a semiconductor device, the workpiece 200 may be referred to as semiconductor device 200 from time to time for simplicity.

Referring to FIGS. 1 and 2, the method 100 includes a block 102 where a workpiece 200 that includes a redistribution layer (RDL) 216 is received. As shown in the example of FIG. 2, the workpiece 200 includes a substrate 202, an interconnect structure 204 over the substrate 202, an etch stop layer 210 over the interconnect structure 204, a first passivation layer 212, a barrier layer 214, and the RDL 216 over and electrically coupled to the interconnect structure 204. In some embodiments, substrate 202 may be made of silicon or other semiconductor materials such as germanium. In some other embodiments, substrate 202 may include a compound semiconductor such as silicon carbide, gallium arsenic, indium arsenide, or indium phosphide. In still other embodiments, substrate 202 may include an alloy semiconductor such as silicon germanium, silicon germanium carbide, gallium arsenic phosphide, or gallium indium phosphide. In some alternative embodiments, the substrate 202 may include an epitaxial layer overlying a bulk semiconductor. Various microelectronic components may be formed in or on the substrate 202, such as transistor components including source/drain features and/or gate structures, isolation structures including shallow trench isolation (STI) structures, passive components, or any other suitable components.

The interconnect structure 204 may be a multi-layer interconnect (MLI) structure, which is formed over the substrate 202 and may include contact vias 2081 and conductive lines 2082 embedded into multiple inter-metal dielectric (IMD) layers 206 to provide interconnections (e.g., wiring) between the various microelectronic components that have been or will be formed on the workpiece 200. There may be intermediate layers or components disposed between the interconnect structure 204 and the substrate 202, but in the interest of simplicity such layers or components are not shown. The IMD layers 206 may include silicon oxide or low-K dielectric materials whose K-values (dielectric constants) are smaller than that of silicon dioxide, which is about 3.9. In some embodiments, the low-K dielectric materials include a porous organosilicate thin film such as SiOCH, tetraethylorthosilicate (TEOS) oxide, un-doped silicate glass, doped silicon oxide such as borophosphosilicate glass (BPSG), fluorosilicate glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), hydrogen silsesquioxane (HSQ), methylsilsesquioxane (MSQ), or combinations thereof.

Contact vias 2081 and conductive lines 2082 are formed in the IMD layers 206. The formation process for the contact vias 2081 and conductive lines 2082 may include single damascene and/or dual damascene processes. In a single damascene process, a trench is first formed in one of the IMD layers 206, followed by filling the trench with a conductive material. A planarization such as a chemical mechanical polishing (CMP) process is then performed to remove the excess portions of the conductive material higher than the top surface of the IMD layer, leaving a metal line in the trench. In a dual damascene process, both a trench and a via opening are formed in an IMD layer, with the via opening underlies and is connected to the trench. The conductive material is then deposited into the trench and the via opening to form a metal line and a metal via, respectively. The conductive material may include a diffusion barrier layer and a copper-containing metallic material over the diffusion barrier layer. The diffusion barrier layer may include titanium, titanium nitride, tantalum, tantalum nitride, tungsten, cobalt, cobalt nitride, tungsten nitride, ruthenium, ruthenium nitride, other metal, or other metal nitride. The copper-containing metallic material may include copper, cupronickel, or a copper-aluminum alloy. Conductive lines 2082 at the same level may be collectively referred to as a metal layer and different metal layers are interconnected by one or more contact vias 2081. In in the example of FIG. 2, the workpiece 200 includes a top metal layer 208, which serves as an interface to the RDL 216.

The workpiece 200 also includes the etch stop layer 210 and the first passivation layer 212 that are formed before the RDL 216. In an embodiment, the etch stop layer 210 may include silicon carbon nitride (SiCN), silicon oxycarbide (SiOCN), silicon oxycarbide (SiOC), silicon carbide (SiC), or silicon nitride (SiN), or combinations thereof. The first passivation layer 212 is formed over the etch stop layer 210. The first passivation layer 212 may be a single layer or a composite layer, and may be formed of a non-porous material. In some instances, the first passivation layer 212 may be a single layer including silicon oxide. In at least some embodiments, the first passivation layer 212 includes an undoped silicate glass (USG) layer.

The RDL 216 is electrically coupled to the interconnect structure 204 by way of openings through the etch stop layer 210 and the first passivation layer 212. In some embodiments, after the openings are formed, the barrier layer 214 is deposited over the workpiece 200 to insulate the to-be-formed RDL 216 from the first passivation layer 212. The barrier layer 214 serves as a diffusion barrier to block copper or aluminum diffusion into the first passivation layer 212 as well as to block oxygen diffusion into the RDL 216 as a result of subsequent annealing processes. The barrier layer 214 may include titanium, titanium nitride, tantalum, tantalum nitride, tungsten, cobalt, cobalt nitride, tungsten nitride, ruthenium, ruthenium nitride, other metal, or other metal nitride. Although not separately shown, a blanket copper seed layer may also be formed over the barrier layer 214 such that the RDL 216 may be formed using electroplating. The RDL 216 may be formed of copper or an aluminum-copper alloy. In some embodiments represented by FIG. 2, the RDL 216 is formed of an aluminum-copper alloy.

Figure 3:
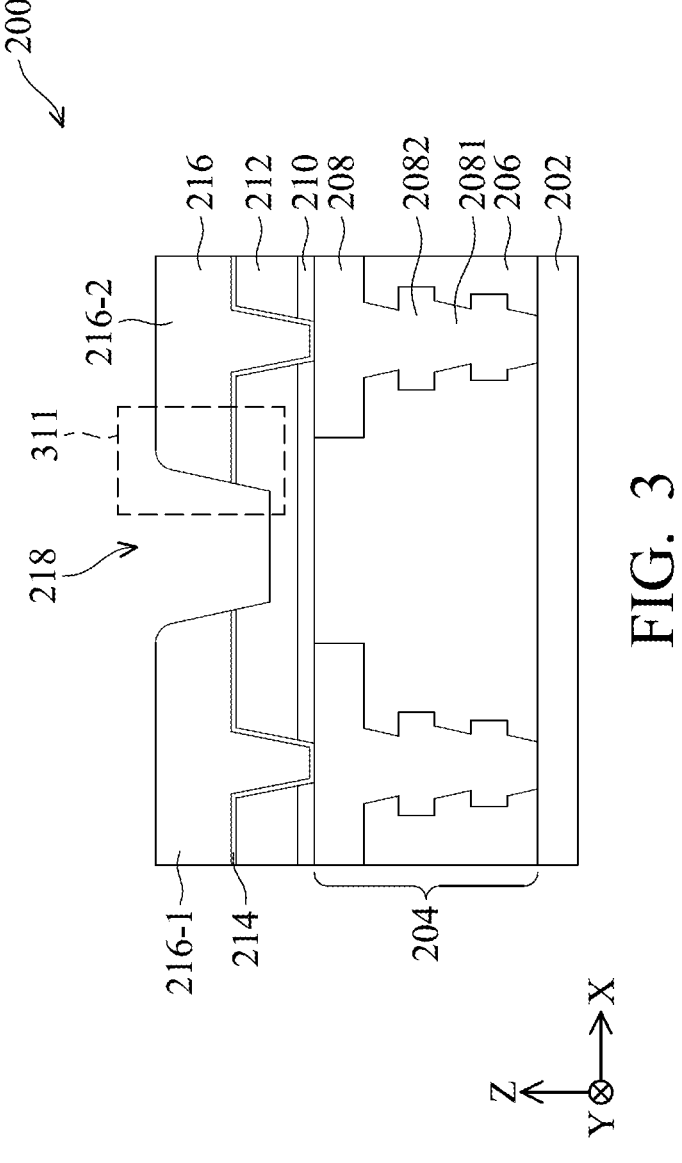
Figure 3D:
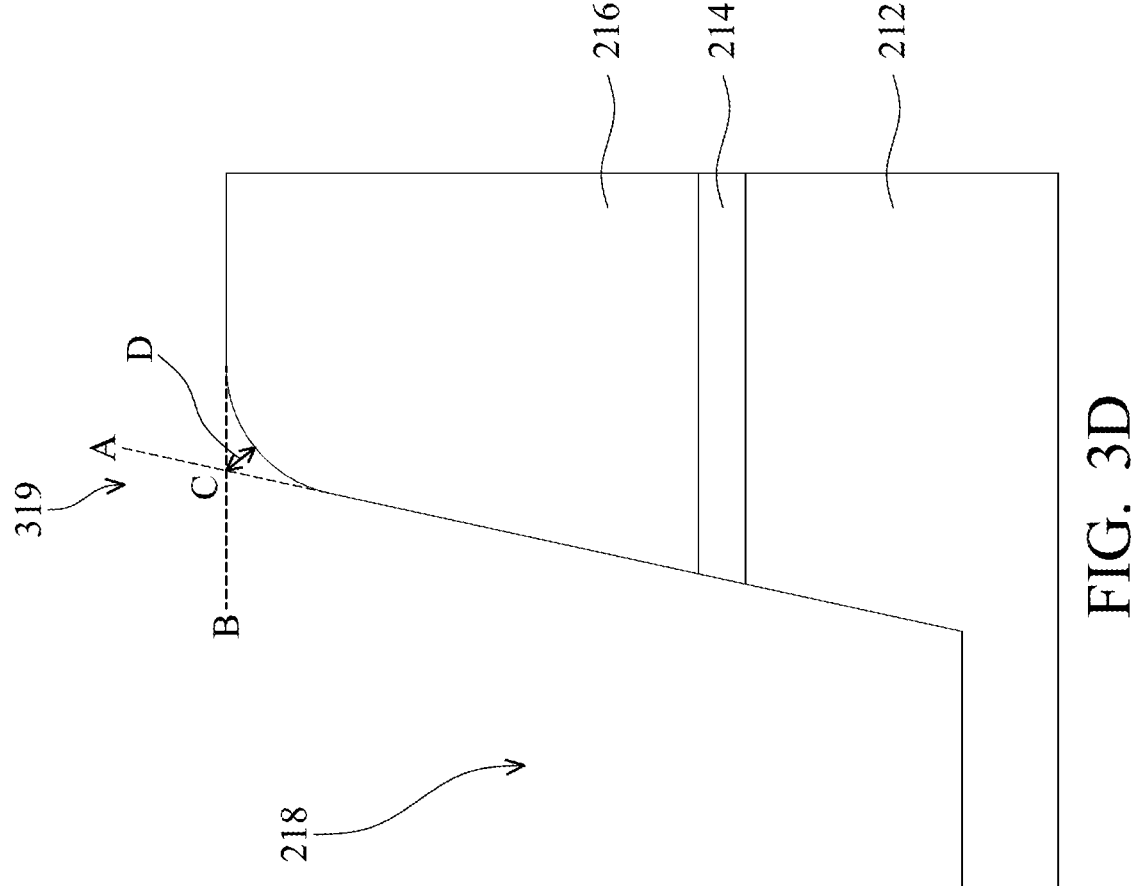

Referring now to FIGS. 1, 3, 3A, 3B, 3C, and 3D, the method 100 includes a block 104 where the RDL 216 is patterned and corners 319 of the RDL 216 are rounded. FIGS. 3A and 3B provide cross-sectional views (e.g., extending along the X direction or the Y direction) of a portion of the workpiece 200 during the patterning of the RDL 216, and FIGS. 3C and 3D provide enlarged views of a portion 311 of the workpiece 200 illustrated in FIG. 3 after the RDL 216 is patterned. Initially, as shown in FIG. 3A, a nitride layer 302 (e.g., such as SiON) is deposited over the RDL 216, and a photoresist layer 304 is formed over the nitride layer 302. While not explicitly shown in all figures, the nitride layer 302 may remain over a top surface of the RDL 216, as shown in FIG. 3B, throughout the processing of the workpiece 200. In various examples, the photoresist layer 304 is exposed (e.g., through a mask) and developed to form a pattern in the photoresist layer 304 that is subsequently transferred to the RDL 216 by an etching process 315 to form a recess 218. A shown in FIGS. 3 and 3C, the recess 218 extends through the RDL 216 to electrically separate the RDL 216 into a first conductive feature 216-1 and a second conductive feature 216-2. Each of the first conductive feature 216-1 and the second conductive feature 216-2 may further extend along the Y direction. In some implementations and as shown in FIGS. 3 and 3C, the recess 218 not only extends through the RDL 216, but also through the barrier layer 214, and into the first passivation layer 212. After patterning the RDL 216, the photoresist layer 304 is removed from over the patterned RDL 216.

In some embodiments, the etching process 315 to pattern and round the corners 319 of the RDL 216 may include one or more etching steps. For example, the etching process 315 may include a main etching step 315A (with at least some over-etching) that etches through the nitride layer 302 and through substantially all of the RDL 216, where the main etching step 315A (and the at least some over-etching) is performed using a first $Cl_2/BCl_3$ gas ratio. Thereafter, and also as part of the etching process 315, a further over-etching step 315B may be performed to etch through the barrier layer 214 and part of the first passivation layer 212, where the further over-etching step 315B is performed using a second $Cl_2/BCl_3$ gas ratio different than the first $Cl_2/BCl_3$ gas ratio. In some examples, transitioning the etching process 315 from the main etching step 315A to the further over-etching step 315B is performed by changing the $Cl_2/BCl_3$ gas ratio from the first $Cl_2/BCl_3$ gas ratio to the second $Cl_2/BCl_3$ gas ratio. In some embodiments, the first $Cl_2/BCl_3$ gas ratio of the main etching step 315A is less than about 2, and the second $Cl_2/BCl_3$ gas ratio of the further over-etching step 315B is in a range from between about 2-3. In some examples, rounding of the corners 319 by the etching process 315 is achieved by ensuring that the photoresist layer 304 is etched to form a dome shape 317, as shown in FIG. 3A. This is done by ensuring that the first $Cl_2/BCl_3$ gas ratio of the main etching step 315A is less than about 2, which causes the photoresist layer 304 to be consumed faster, especially along lateral ends, to form the dome shape 317. By providing the dome shape 317, the corners 319 will be more exposed and amenable to rounding by the etching process 315. In contrast, for at least some existing techniques that use a $Cl_2/BCl_3$ gas ratio of the main etching step 315A that is equal to or greater than 2, the corners 319 may remain substantially square-shaped and are thus not amenable to rounding. After the etching process 315 of block 104, any remaining portion of the photoresist layer 304 is removed, while the nitride layer 302 remains.

Still referring to FIGS. 1, 3, 3A, 3B, 3C, and 3D, the method 100 includes a block 105 where the corners 319 of the RDL 216 are further rounded. In particular, after removing any remaining portion of the photoresist layer 304, the corners 319 of the RDL 216 are further rounded by performing an argon (Ar) ion bombardment step 321. In some examples, the Ar ion bombardment step 321 is primarily directed at the corners 319, as shown in FIG. 3B. The Ar ion bombardment step 321 may be performed for about 10-30 seconds, for example, depending on a pattern density (PD) of the RDL 216. For instance, the Ar ion bombardment step 321 may be performed for a shorter amount of time for an RDL 216 with a lower PD, and for a greater amount of time for an RDL 216 with a higher PD. As merely one example, the Ar ion bombardment step 321 may be performed for about 10 seconds for an RDL 216 having a low PD and for about 30 seconds for an RDL 216 having a high PD. In various embodiments, the Ar ion bombardment step 321 serves to further enhance the rounding of the corners 319 of the RDL 216. It is further noted that in some examples, the density of the as-deposited RDL 216 may be modified (e.g., by modifying the deposition rate of the RDL 216), and as a result, the corner rounding of the RDL 216 provided by the etching process 315 (block 104) and the Ar ion bombardment step 321 (block 105) may be improved.

As noted above, FIG. 3C provides an enlarged view of a portion 311 of the workpiece 200 illustrated in FIG. 3 after the RDL 216 is patterned (e.g., after the Ar ion bombardment step 321 of block 105). In particular, the example of FIG. 3C provides an exemplary technique for measuring an extent of rounding of the corners 319 of the RDL 216. As shown, a circle may be drawn such that the surface of the rounded corners 319 overlaps with a portion of a circumference (an arc 'S') of the circle. A length of the arc 'S' may be determined according to the equation: arc length=$2\pi R*(\theta/360)$, where R is the radius of the circle and $\theta$ is the central angle of the arc 'S'. In the example shown, the central angle $\theta$ is equal to about 90 degrees, and the radius R is in a range of about 200-210 nm. Thus, in the example of FIG. 3C, the length of the arc 'S' is in a range of about 314-330 nm. The length of the arc 'S' may thus be equivalently referred to as the length of the rounded portion of the corners 319 of the RDL 216.

FIG. 3D also provides an enlarged view of the portion 311 of the workpiece 200 illustrated in FIG. 3 after the RDL 216 is patterned (e.g., after the Ar ion bombardment step 321 of block 105), as previously noted. The example of FIG. 3D provides an exemplary alternative technique for measuring an extent of rounding of the corners 319 of the RDL 216. As shown, tangent lines can be drawn that are tangent to the sidewall surface of the patterned RDL 216 (tangent line A) and tangent to the top surface of the patterned RDL 216 (tangent line B). As shown, the two tangent lines A and B intersect at a point C. In an example, the corner rounding can then be described as a distance D between the intersection point C and the rounded surface of the RDL 216. In some embodiments, this may also be described as a distance D by which the corner of the patterned RDL 216 has "withdrawn" from the intersection point C due to the corner rounding. In various embodiments, the distance D may be greater than or equal to about 70 nm.

Figure 4:
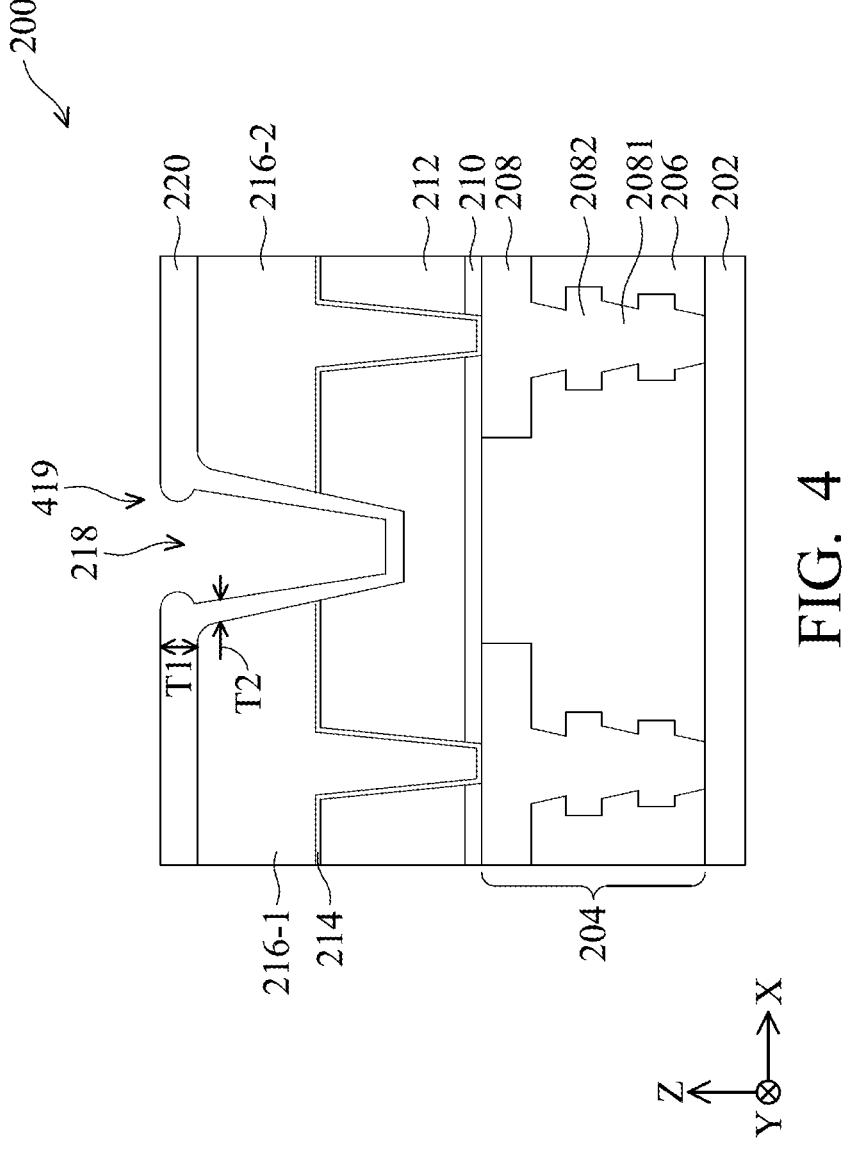

Referring now to FIGS. 1 and 4, the method 100 includes a block 106 where a first dielectric layer 220 is deposited over the patterned RDL 216 that includes the first conductive feature 216-1 and the second conductive feature 216-2, including within the recess 218. As noted above, and in some embodiments, since the nitride layer 302 remains over the RDL 216, the first dielectric layer 220 may be deposited over the nitride layer 302. In some embodiments, the first dielectric layer 220 includes silicon oxide and may be formed using chemical vapor deposition (CVD), sub-atmospheric CVD (SACVD), or plasma-enhanced CVD (PECVD). In some implementations, the first dielectric layer 220 may be an undoped silicate glass (USG) layer formed to a thickness between about 1500 Angstroms (Å) and about 5000 Å. In at least some examples, the first dielectric layer 220 has a thickness of about 4000 Å. As shown in the example of FIG. 4, in some embodiments and due to the aspect ratio of the recess 218 and/or to the deposition process used to deposit the dielectric layer 220, the deposited first dielectric layer 220 may accumulate over the corners 319 of the RDL 216 adjacent to the recess 218 to form overhang regions 419. As a result, the as-deposited thickness of the first dielectric layer 220 may be non-conformal. For example, the first dielectric 220 may have a thickness 'T1' between about 3000 Å and about 5000 Å along a top surface of the RDL 216 (on a first side of the overhang region 419) and a thickness 'T2' between about 2000 Å and about 4000 Å along a sidewall surface of the RDL 216 within the recess 218 (on a second side of the overhang region 419).

Figure 5:
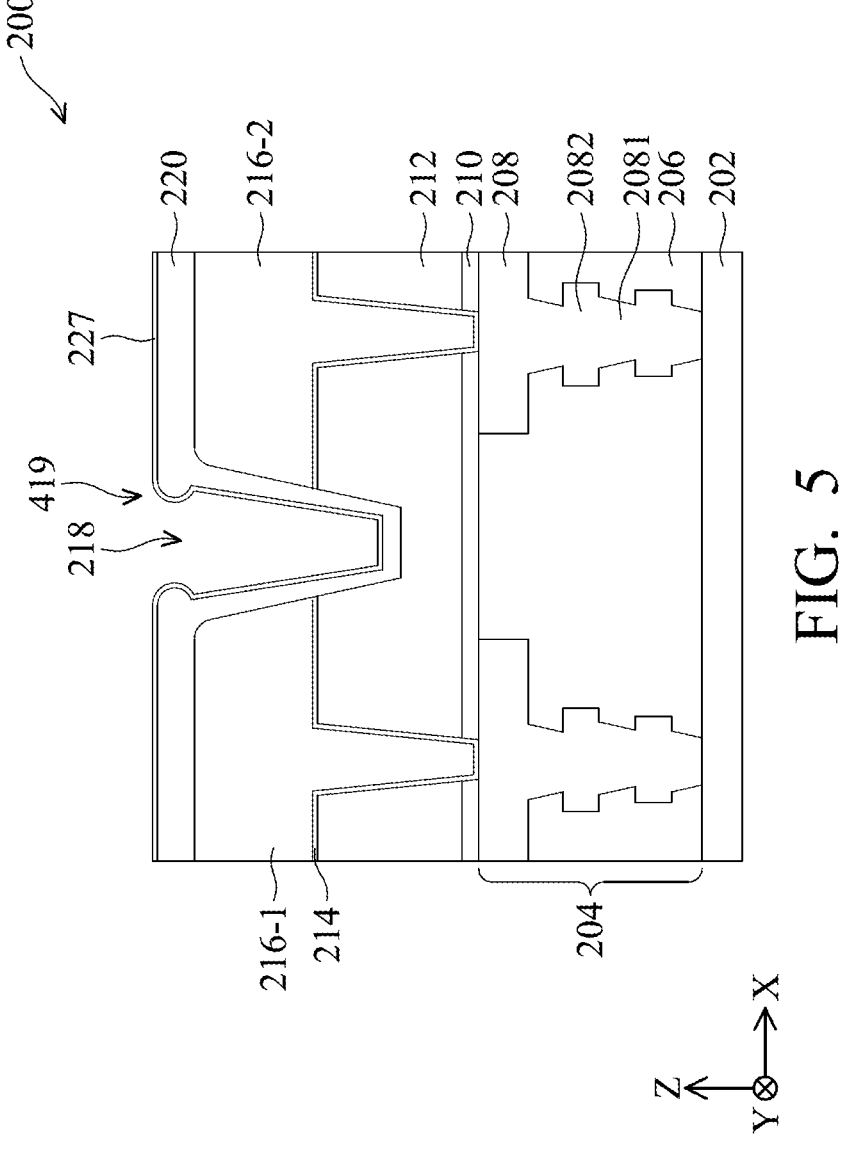

Referring now to FIGS. 1 and 5, the method 100 includes a block 107 where a nitride layer 227 is deposited over the first dielectric layer 220, including within the recess 218 and over the overhang regions 419. In some embodiments, the nitride layer 227 includes silicon nitride (SiN) and may be formed using CVD, SACVD, or PECVD. In some implementations, the nitride layer 227 may be formed to a thickness between about 675 Å and about 825 Å. In at least some cases, the nitride layer 227 may be formed to a thickness of about 750 Å. In some examples, the nitride layer 227 may serve as an etch-stop layer. Moreover, as the nitride layer 227 has a high Young's modulus, the nitride layer 227 can constrain the RDL 216 during subsequent annealing processes and cause residual stress to form in the RDL 216. In accordance with some embodiments, and as described further below, portions of the nitride layer 227 at the overhang regions 419 (and over the corners 319) can be removed (or chopped) so as to release the residual stress from corners 319 of the RDL 216 where such stress can accumulate.

Referring now to FIGS. 1, 6, 7, and 8, the method 100 includes a block 108 where a second dielectric layer 222 is formed. The second dielectric layer 222 is formed using a deposition technique different from the one used to deposit the first dielectric layer 220. In some embodiments, the second dielectric layer 222 includes silicon oxide and may be deposited using a high-density plasma chemical vapor deposition (HDPCVD) process. In various examples, the HDPCVD deposition of the second dielectric layer 222 includes alternating deposition and etching-back cycles to chop portions of the nitride layer 227 in the overhang regions 419, thereby releasing residual stress from corners 319 of the RDL 216. The HDPCVD deposition also provides excellent gap fill (e.g., of the recess 218) and a void-free dielectric layer (the second dielectric layer 222) over the RDL 216. In some cases, the various deposition and etching-back cycles may be performed at different radio frequency (RF) power values and/or at different pressures, as discussed below. Also, in some embodiments, the deposition and etching-back cycles may occur concurrently, with a net positive deposition rate.

Figure 6:
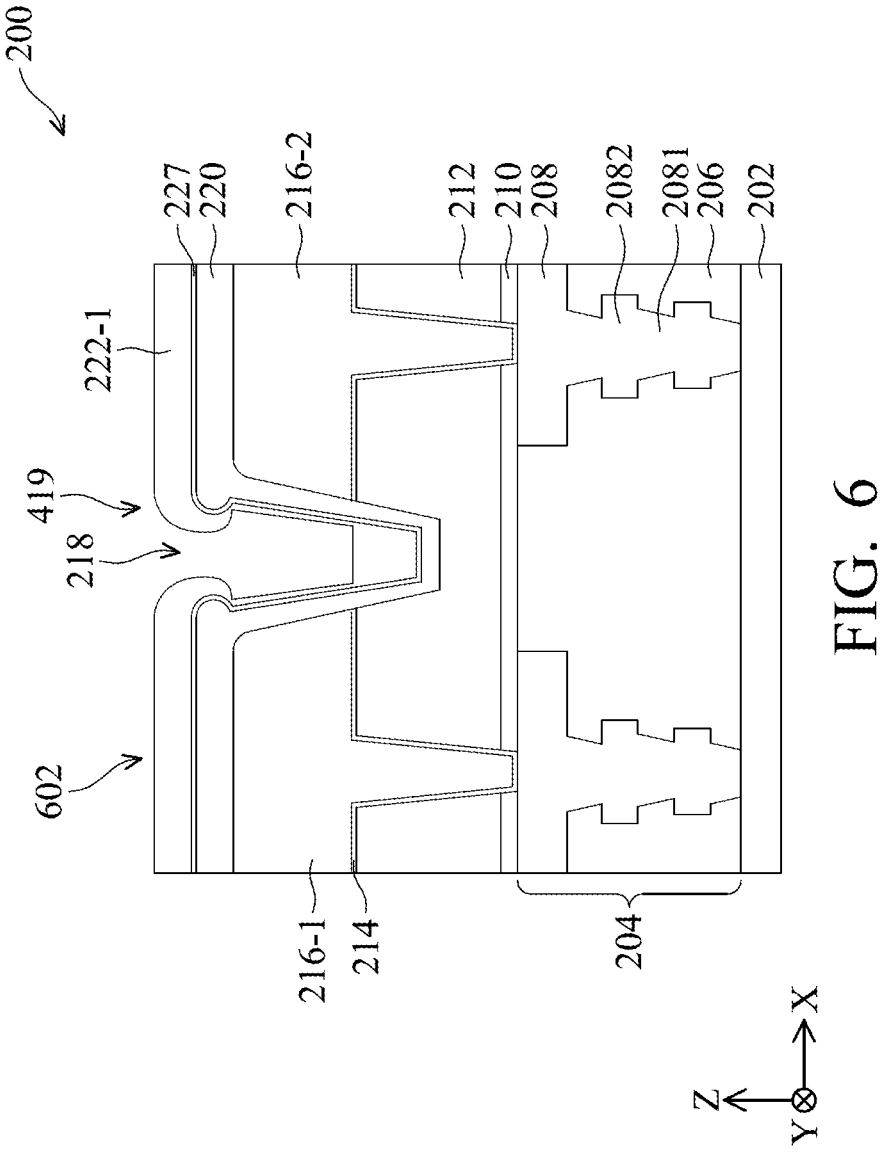

By way of example, and as shown in FIG. 6, the HDPCVD deposition of the second dielectric layer 222 begins with a first deposition of the second dielectric layer 222 (denoted in FIG. 7 as 222-1) over the nitride layer 227, including within the recess 218 and over the overhang regions 419. In an example, the first deposition of the second dielectric layer 222 may be performed at an RF power of between about 4.7 kW and about 6.7 kW, such as for instance about 5.7 kW, and at a pressure in a range of between about 4E-3 Torr and 5E-3 Torr. In some implementations, the first deposition of the second dielectric layer 222-1 may be formed to a thickness between about 250 nm and about 350 nm along a top surface 602 of the workpiece 200. In at least some examples, the first deposition of the second dielectric layer 222-1 may have a thickness of about 300 nm. It is noted that due to the overhang regions 419, the first deposition of the second dielectric layer 222-1 may be thinner within the recess 218 (e.g., such as along sidewalls of the recess 218) as compared to the top surface 602.

Figure 7:
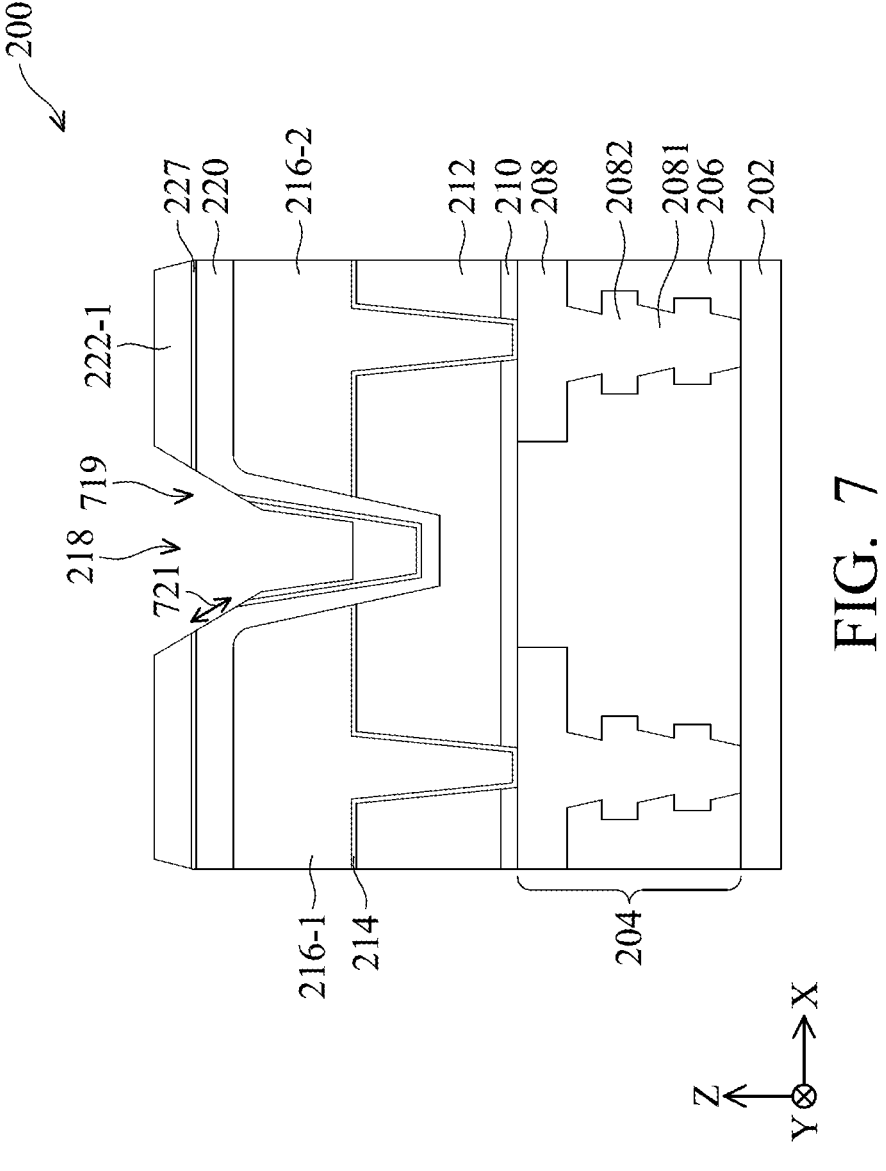

After the first deposition of the second dielectric layer 222-1, the HDPCVD process continues with an etching-back process. With reference to FIG. 7, an etching-back process is performed (e.g., using an oxygen-containing species, such as high-energy oxygen atoms) to remove a portion of the previously deposited first deposition of the second dielectric layer 222-1. In some embodiments, the etching-back process is performed at a high RF power of about 8 kW and at a pressure of about 9E-3 Torr. In some embodiments, the etching-back process may be performed at an RF power of between about 7 kW and about 9 kW, and at a pressure in a range of between about 10E-2 Torr and 10E-3 Torr. In some cases, the etching-back process may cause thinning of a thickness of the first deposition of the second dielectric layer 222-1 along the top surface 602. More particularly, the etching-back process may preferentially etch the workpiece 200 at or near the overhang regions 419. As a result, the etching-back process may remove (or chop) corners of the first deposition of the second dielectric layer 222-1, the nitride layer 227, and the first dielectric layer 220 in the overhang regions 419 to form etched surfaces 719 that define a discontinuity region 721 in the nitride layer 227. As shown, the discontinuity region 721 in the nitride layer 227 is substantially aligned with the corners 319 of the RDL 216, thereby providing for residual stress from the corners 319 of the RDL 216 to be released.

Figure 8:
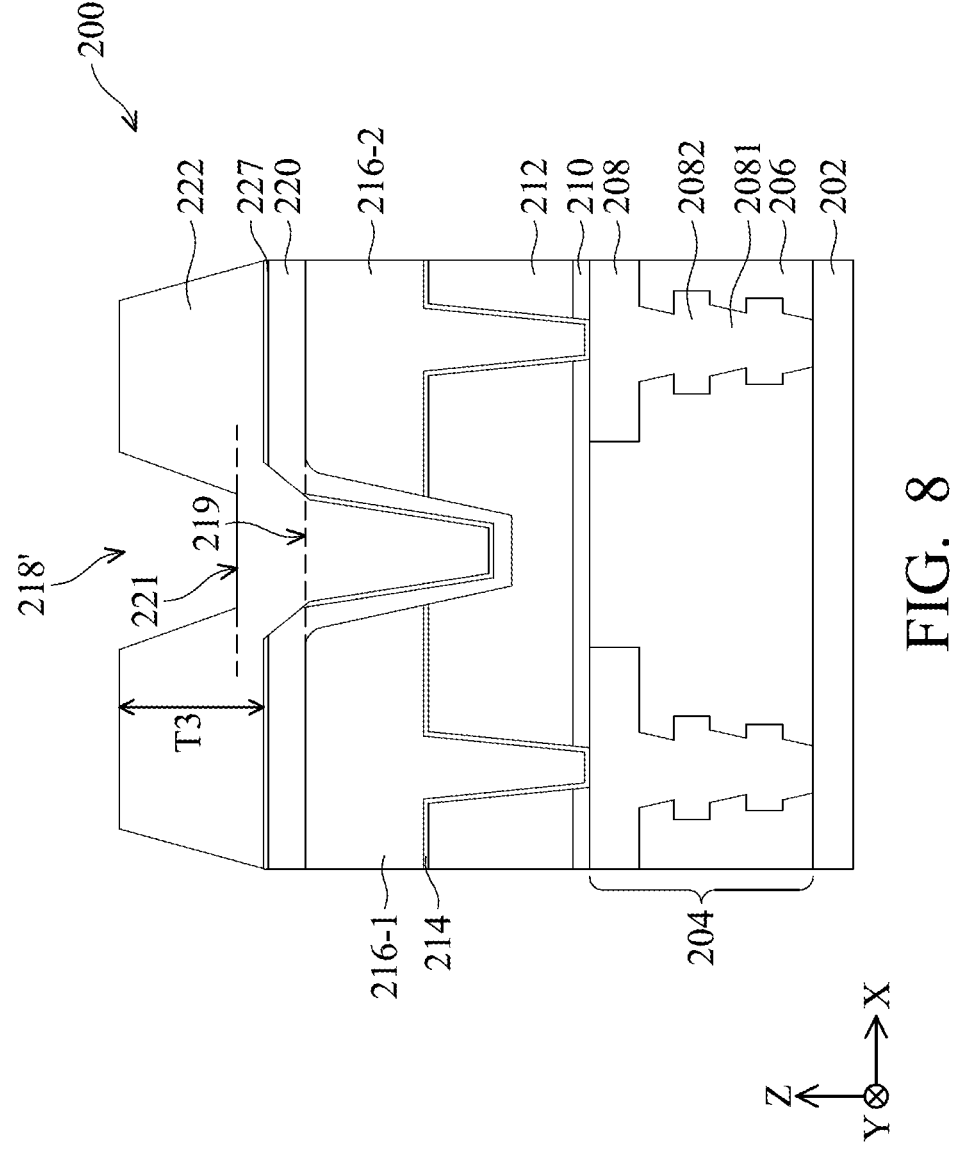

After performing the etching-back process to form the etched surfaces 719, and as shown in FIG. 8, the HDPCVD process continues with a second deposition of the second dielectric layer 222 over the first deposition of the second dielectric layer 222-1 (on the top surface 602 and within the recess 218), and over the etched surfaces 719 that include the discontinuity region 721 in the nitride layer 227. In some embodiments, the second deposition of the second dielectric layer 222 is performed at a low RF power of about 5.7 kW and at a pressure of about 4.5E-3 Torr. In some embodiments, the second deposition of the second dielectric layer 222 may be performed at an RF power of between about 4.7 kW and about 6.7 kW, and at a pressure in a range of between about 4E-3 Torr and 5E-3 Torr. In some implementations, the second deposition of the second dielectric layer 222 may be formed to a thickness between about 2,225 nm and about 2,750 nm. In at least some examples, the second deposition of the second dielectric layer 222 may have a thickness of about 2,500 nm. In one example, a total thickness 'T3' of the second dielectric layer 222, which includes the net deposition of both the first and second depositions of the second dielectric layer 222, may be about 2,700 nm.

It is noted that while after the second deposition of the second dielectric layer 222 the recess 218 is substantially filled, because of the topography of the workpiece 200, a dent 218' remains. In some embodiments, the second dielectric layer 222 is deposited to the thickness 'T3' to ensure that a bottom surface 221 of the dent 218' is higher (farther away from the substrate 202) than a top surface 219 of the RDL 216. When the bottom surface 221 is higher (farther away from the substrate 202) than the top surface 219, the first conductive feature 216-1 and the second conductive feature 216-2 are spaced apart by portions of the first dielectric layer 220, the nitride layer 227, and the second dielectric layer 222, and a third dielectric layer 224 (shown in FIG. 9) does not extend between the first conductive feature 216-1 and the second conductive feature 216-2. That means the first conductive feature 216-1 and the second conductive feature 216-2 are separated largely by the second dielectric layer 222, which may include high-quality and substantially void-free silicon oxide deposited using HDPCVD.

Figure 9:
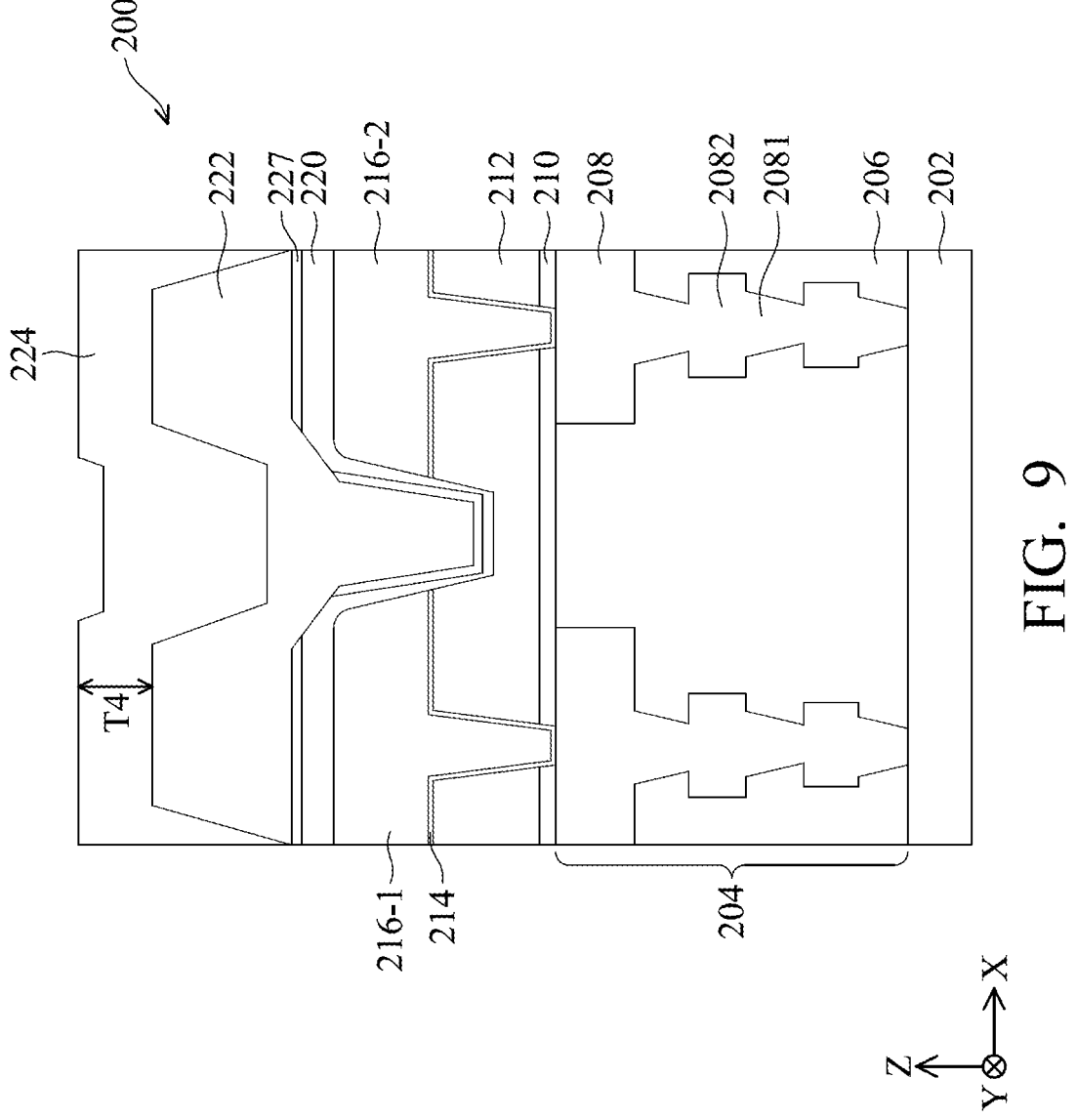

Referring now to FIGS. 1 and 9, the method 100 includes a block 110 where a third dielectric layer 224 is deposited over the second dielectric layer 222. The third dielectric layer 224 is deposited using a deposition technique different from the one used to deposit the second dielectric layer 222. In some embodiments, the third dielectric layer 224 includes silicon oxide and may be deposited using CVD, SACVD, or PECVD. In some implementations, the third dielectric layer 224 may be an undoped silicate glass (USG) layer formed to a thickness 'T4' between about 8,000 Angstroms (Å) and about 10,000 Å. The thickness 'T4' is selected such that a lowest top surface of the third dielectric layer 224 is higher (farther away from the substrate 202) than a top surface of the second dielectric layer 222. This arrangement helps to ensure that after the planarization process at block 112 (described below), the workpiece 200 would include a level top surface.

Figure 10:
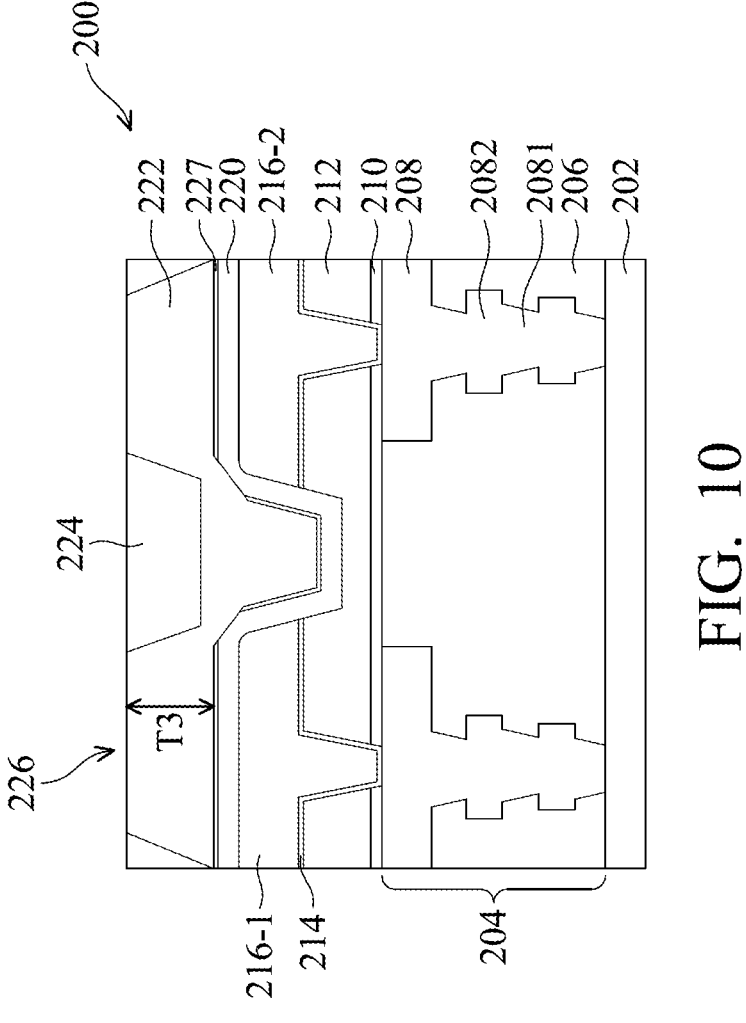

Referring now to FIGS. 1 and 10, the method 100 includes a block 112 where a top surface of the workpiece 200 is planarized to provide a level top surface 226. In some embodiments, the workpiece 200 is planarized using CMP. Portions of the third dielectric layer 224 and the second dielectric layer 222 are removed at block 112 to produce the level top surface 226. In some embodiments, and after the CMP process, the total thickness 'T3' of the second dielectric layer 222 may be between about 900 nm and about 1,500 nm. As illustrated in FIG. 10, the level top surface 226 includes a portion of the third dielectric layer 224 and a portion of the second dielectric layer 222.

Figure 11:
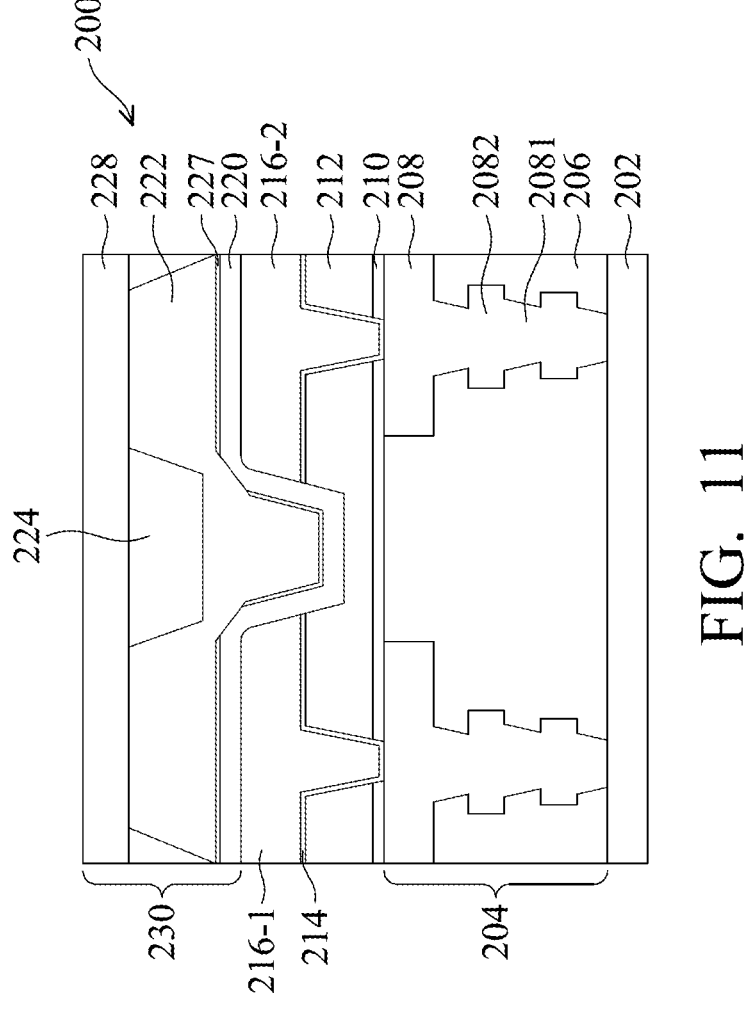

Referring to FIGS. 1 and 11, the method 100 includes a block 114 where a fourth dielectric layer 228 is deposited over the level top surface 226. In some embodiments, the fourth dielectric layer 228 may be a nitrogen-containing dielectric material such as silicon nitride or silicon carbonitride and may be deposited using CVD, PECVD, HDPCVD, SACVD, or a suitable deposition technique. In one embodiment, the fourth dielectric layer 228 is formed of silicon nitride. Because the fourth dielectric layer 228 is deposited over and in direct contact with the level top surface 226, the fourth dielectric layer 228 is planar and does not extend downward (towards the substrate 202) into either the third dielectric layer 224 or the second dielectric layer 222. In some implementations, the fourth dielectric layer 228 is formed to a thickness between about 4,000 Å and about 10,000 Å, including about 7,000 Å. In some cases, the fourth dielectric layer 228 is a barrier layer, for example protecting against moisture or other contaminants, to protect the underlying elements of the workpiece 200. The first dielectric layer 220, the nitride layer 227, the planarized second dielectric layer 222, the planarized third dielectric layer 224, and the fourth dielectric layer 228 may be regarded as a second passivation layer 230. As illustrated in FIG. 11, the RDL 216, such as the first conductive feature 216-1 and the second conductive feature 216-2, is thus sandwiched between the underlying first passivation layer 212 and the overlying second passivation layer 230.

Figure 12:
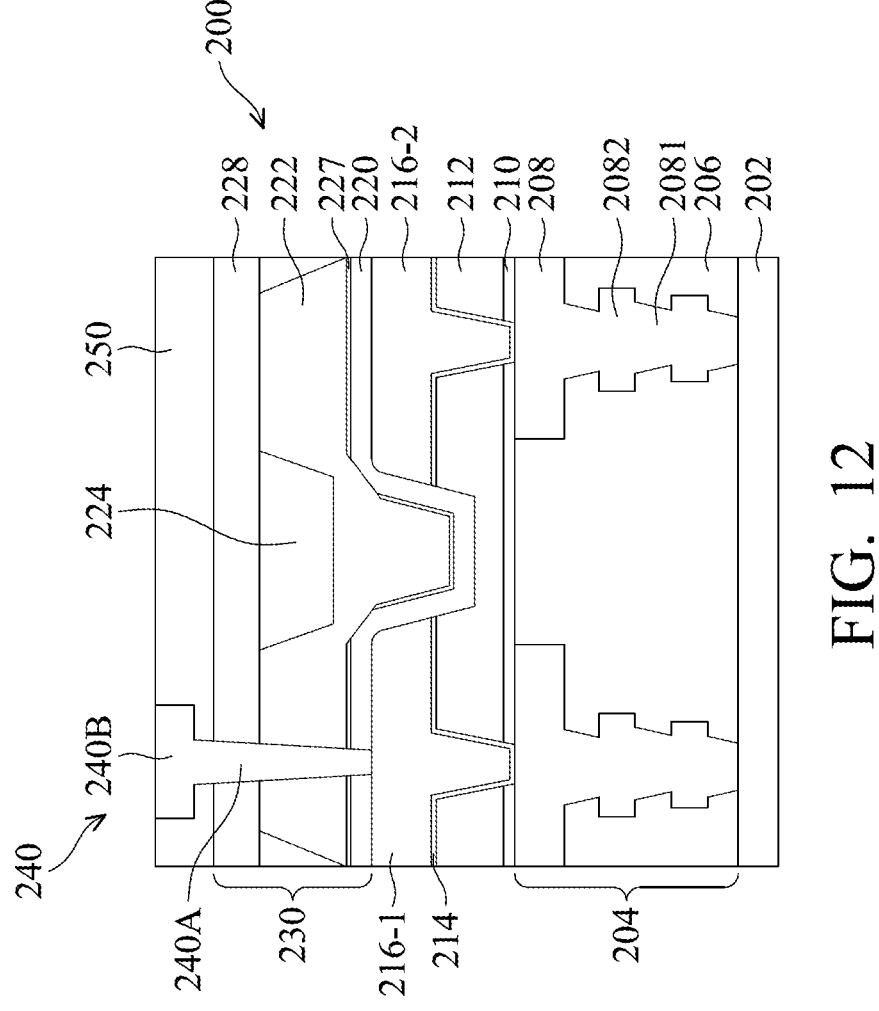

Referring to FIGS. 1 and 12, the method 100 includes a block 116 where a bonding layer 250 is formed over the fourth dielectric layer 228. In some embodiments, the bonding layer 250 may include an oxide or nitrogen-containing dielectric material such as $SiO_2$, SiN, SiON, SiCN, or SiOCN and may be deposited using CVD, PECVD, HDPCVD, SACVD, or a suitable deposition technique. In one embodiment, the bonding layer 250 is formed of SiON. In some cases, the bonding layer 250 provides for improved bonding between the workpiece 200 (which may include a first die) and another workpiece (which may include a second die), for example, as part of a subsequent die-to-die stacking process.

Still referring to FIGS. 1 and 12, the method 100 includes a block 118 where contact features, such as a contact feature 240 including a conductive via portion 240A and a conductive line portion 240B, are formed. Initially, a contact recess may be formed through the bonding layer 250, the fourth dielectric layer 228, the second dielectric layer 222, the nitride layer 227, and the first dielectric layer 220 to expose the first conductive feature 216-1. After forming the contact recess, a metal layer is deposited therein to form the contact feature 240. The contact features, such as the contact feature 240, may be formed of copper, nickel, cobalt, aluminum, gold, silver, palladium, tin, bismuth, or an alloy thereof and may be deposited by electroplating, evaporation, electroless plating, sputter deposition, or other suitable technique. In an example, the contact feature 240 is formed of copper. After formation of the contact feature 240, a CMP process may be performed to remove excess material and planarize a top surface of the workpiece 200. In some embodiments, the first conductive feature 216-1 thus serves as a contact pad to engage the contact feature 240 formed there above. In some examples, a contact feature may be similarly formed to engage the second conductive feature 216-2, and other contact features may also be formed to engage other conductive features (e.g., of the RDL 216) not explicitly shown.

Figure 13:
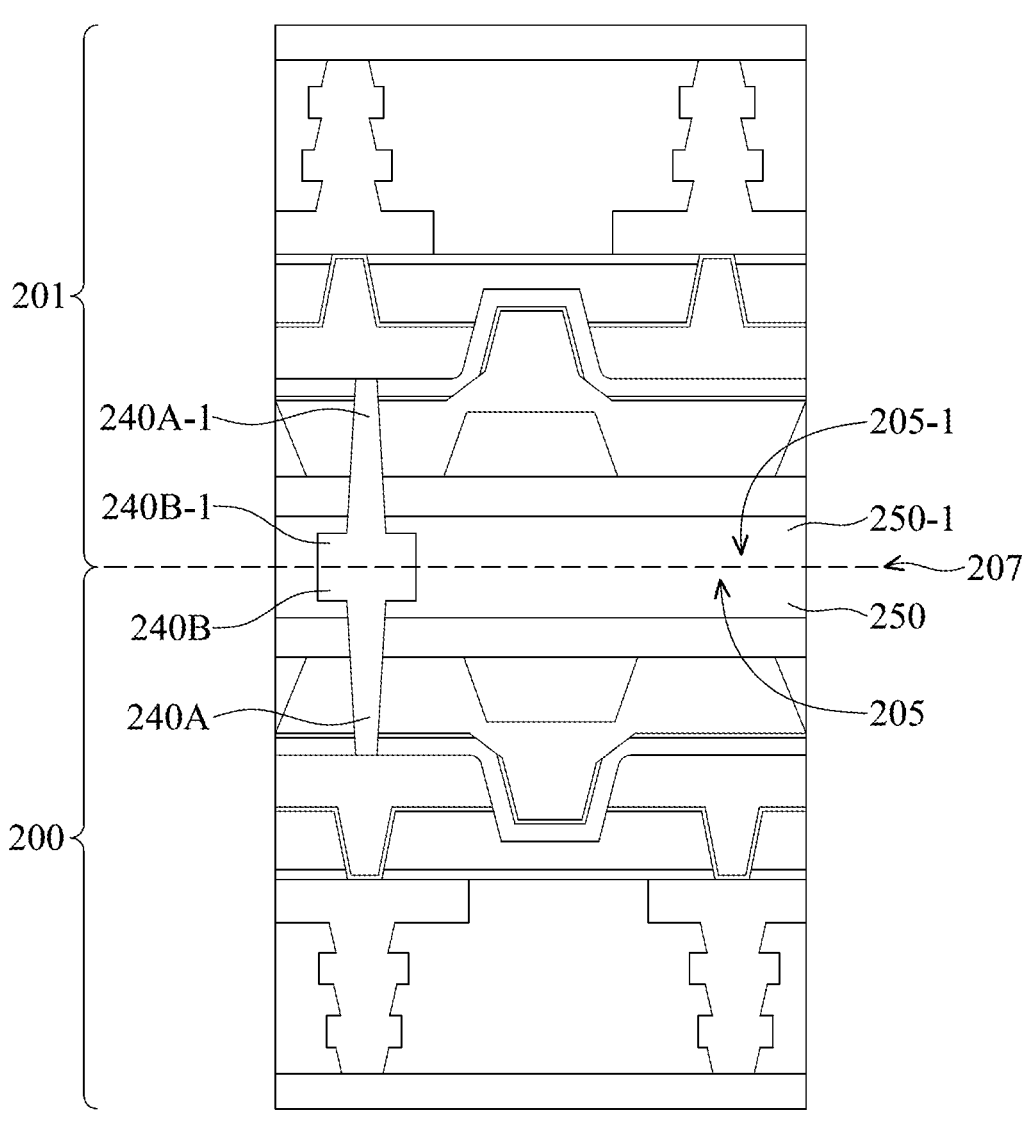

Referring to FIGS. 1 and 13, the method 100 includes a block 120 where a bonding process is performed. In an example, the bonding process may be a hybrid bonding process which includes bonding of metal pads (e.g., such as the conductive line portion 240B of the contact feature 240) and the surrounding dielectric material (e.g., such as the bonding layer 250) of two IC chips (die), two wafers, or a die and a wafer to create a low profile, low parasitic, high-performance interconnect therebetween. In the example of FIG. 13, the workpiece 200 provides a first die 200 (or IC chip), and another workpiece 201 may be similarly processed according to the method 100 to provide a second die 201 (or IC chip) which can be bonded to the first 200 die as part of the bonding process. In the example shown, the second die 201 may be flipped so that a front side 205 of the first die 200 faces, and is in contact with, a front side 205-1 of the second die 201. It is noted that prior to contacting the first die 200 and the second die 201, a surface activation process may be performed to each of the front side 205 of the first die 200 and the front side 205-1 of the second die 201. In some embodiments, the surface activation may include a plasma treatment process (e.g., such as using an Ar plasma) to increase the bonding energy of the bonding layer 250 of the first die 200 and a bonding layer 250-1 of the second die 201.

After the surface activation process, and using a high precision alignment process, the front side 205 of the first die 200 may be brought into contact with the front side 205-1 of the second die 201 along an interface 207 such that the conductive line portion 240B of the first die 200 is substantially aligned with a conductive line portion 240B-1 of the second die 201. In some embodiments, the surfaces of the bonding layer 250 and the bonding layer 250-1, which are now in contact with each other along the interface 207, may form covalent bonds and/or may be attracted to each other by van der Waals forces. In some cases, the bonding of the surfaces of the bonding layer 250 and the bonding layer 250-1 may occur at room temperature. Once the front side 205 of the first die 200 is brought into contact with the front side 205-1 of the second die 201, an annealing process may be performed to form an electrical connection between the conductive line portion 240B of the first die 200 and the conductive line portion 240B-1 of the second die 201. In some cases, the annealing process may be performed at a temperature between about 200 degrees Celsius and about 400 degrees Celsius. As an example, for instance when the contact features 240 are formed of copper, the annealing process may result in volume expansion of the copper, including filling of any gaps that may have been present between the conductive line portion 240B and the conductive line portion 240B-1 (e.g., due to CMP dishing), thereby completing the electrical connection between the conductive line portion 240B and the conductive line portion 240B-1. It is noted that in accordance with various embodiments which provide for the release of residual stress from the RDL 216, the formation of cracks (e.g., in the second passivation layer 230) can be substantially avoided during the annealing process to form the electrical connection between the conductive line portions 240B, 240B-1, as well as during other annealing processes that may be performed during fabrication of the first die 200 and the second die 201. As a result, device yield and reliability are enhanced, and the process of bonding of the first die 200 to the second die 201 is improved.

Figure 14:
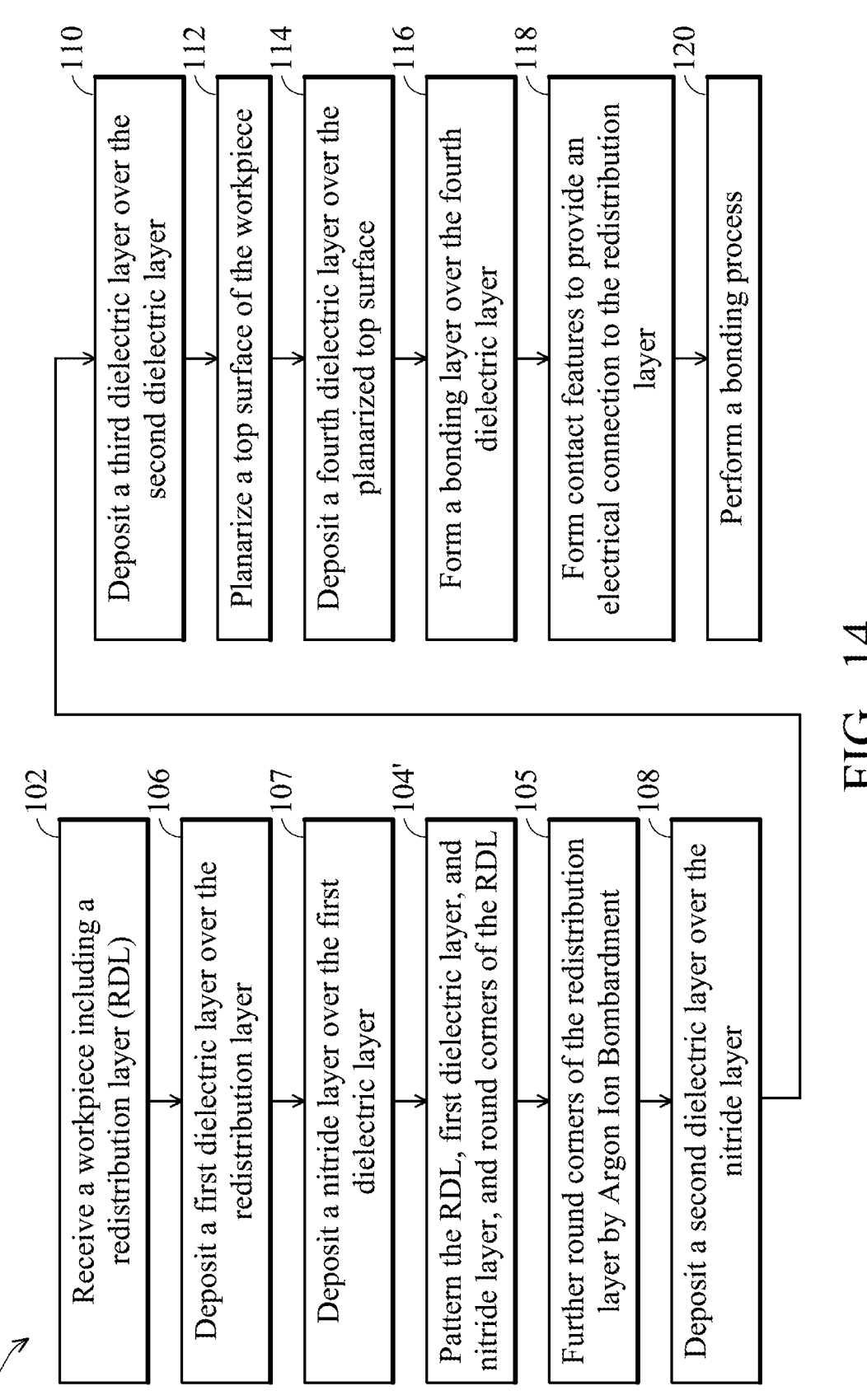
FIG. 14 is a flow chart of a method for fabricating a semiconductor device in accordance with some alternative embodiments of the present disclosure.

Referring now to FIG. 14, illustrated therein is a flowchart illustrating a method 150 for fabricating a semiconductor device according to some alternative embodiments of the present disclosure. The method 150 is merely an example and is not intended to limit the present disclosure to what is explicitly illustrated in the method 150. Additional steps can be provided before, during, and after the method 150, and some steps described can be replaced, eliminated, or moved around for additional embodiments of the method. Not all steps are described herein in detail for reasons of simplicity. The method 150 is described below in conjunction with FIGS. 15-22, which provide cross-sectional views of the workpiece 200 at different stages of fabrication according to embodiments of the present disclosure. It is noted that the method 150 is substantially similar to the method 100, described above. As such, the discussion of the method 150 provided below focuses primarily on the differences between the methods 100, 150. Moreover, unless otherwise stated, like reference numerals in the figures may refer to the same features or elements previously described.

Figure 15:
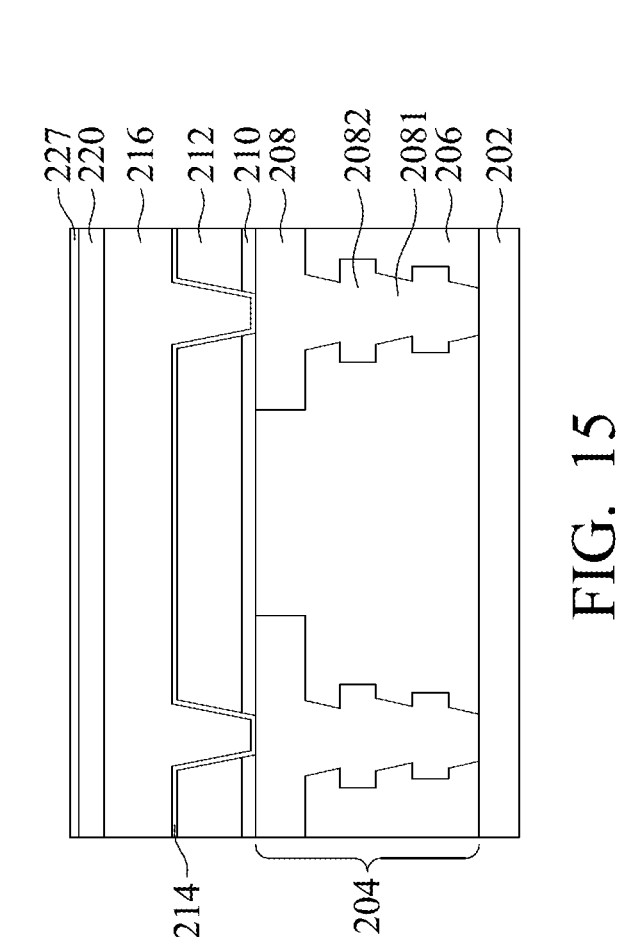
FIGS. 15, 16, 17, 18, 19, 20, 21, and 22 are cross-sectional views of a workpiece at various stages of fabrication according to the method of FIG. 14, in accordance with some embodiments.

Referring to FIGS. 14 and 15, the method 150 includes the block 102 where the workpiece 200 that includes the RDL 216 is received. In some embodiments, the workpiece 200 may be substantially the same as described above with reference to the example of FIG. 2. Still referring to FIGS. 14 and 15, instead of initially patterning the RDL 216 as in the method 100, the method 150 first proceeds to the block 106 where the first dielectric layer 220 is deposited over the RDL 216. After depositing the first dielectric layer 220, and still with reference to FIGS. 14 and 15, the method 150 proceeds to the block 107 where the nitride layer 227 is deposited over the first dielectric layer 220. It is noted that in at least some embodiments, the first dielectric layer 220 may not be formed and instead the nitride layer 227 may be formed directly over the nitride layer 302 (e.g., such as SiON) that remains over the RDL 216 (e.g., as shown in FIG. 3B).

Figure 16:
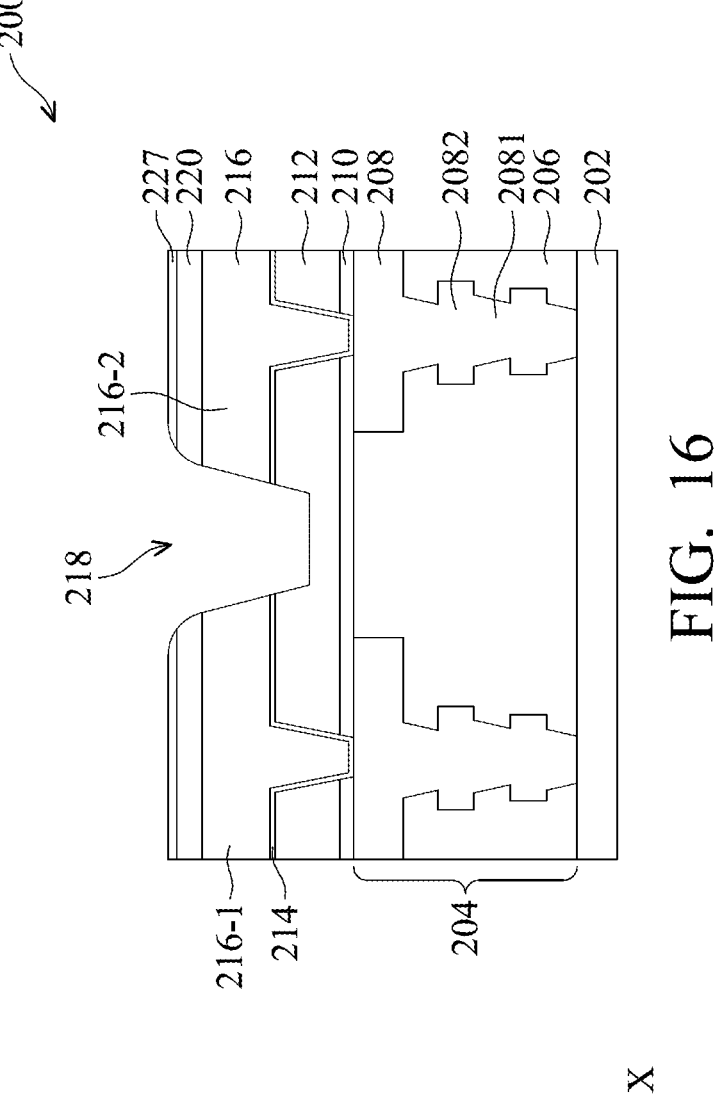

Referring to FIGS. 14 and 16, the method 150 includes a block 104' where the RDL 216, the first dielectric layer 220, and the nitride layer 227 are patterned to form the recess 218 and corners 319 of the RDL 216 are rounded. A shown in FIG. 16, the recess 218 extends through the nitride layer 227, the first dielectric layer 220, and the RDL 216 to electrically separate the RDL 216 into the first conductive feature 216-1 and the second conductive feature 216-2. The etching process 315 may be used to pattern and round the corners 319 of the RDL 216, as previously described. However, in some embodiments of the method 150, since the dielectric layer 220 and the nitride layer 227 are deposited prior to the patterning and rounding process, corners of the dielectric layer 220 and the nitride layer 227 (disposed directly above the corners 319 of the RDL 216) may likewise be rounded by the etching process 315. More particularly, since the nitride layer 227 is deposited prior to the patterning and rounding process of block 104', the nitride layer 227 is absent from the recess 218 (and thus absent from sidewalls of the RDL 216), in contrast to the method 100. In other words, the nitride layer 227 is only formed over a top surface the RDL 216 and not over sidewalls of the RDL 216. As a result, constraint on the RDL 216 by the nitride layer 227 will be significantly reduced and residual stress from the RDL 216 will be released. Further, as the nitride layer 227 may be used as an etch-stop layer, formation of the nitride layer 227 over only the top surface of the RDL 216 will reduce an etch-stop layer area by greater than about 20%, including about 24%. In some cases, this may also help to reduce formation of voids in or adjacent to the RDL 216.

After the patterning and rounding process of block 104', the method 150 includes the block 105 where the corners 319 of the RDL 216 (and in some embodiments corners of the dielectric layer 220 and the nitride layer 227 disposed directly over the corners 319 of the RDL 216) are further rounded. In some embodiments, the further rounding may be performed by using the Ar ion bombardment step 321, as described above.

Figure 17:
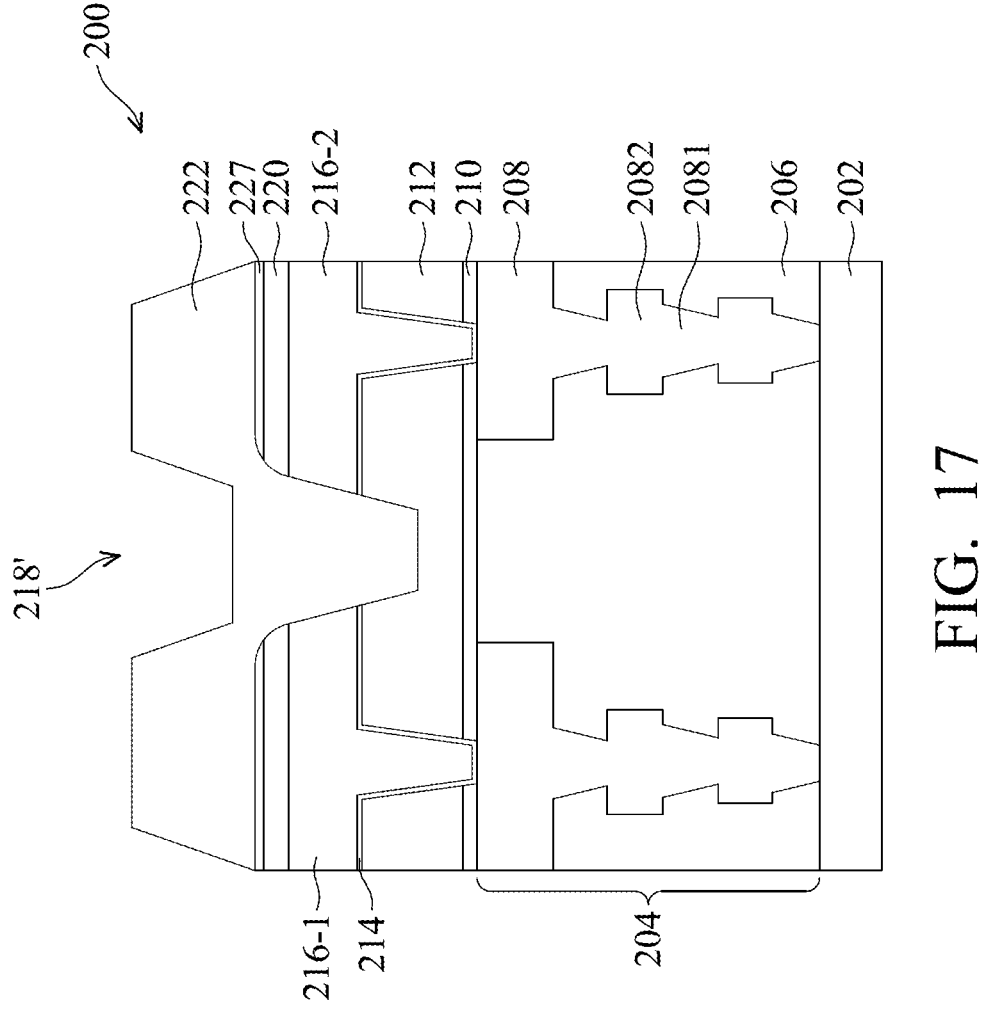

Referring to FIGS. 14 and 17, the method 150 includes the block 108 where the second dielectric layer 222 is formed. The second dielectric layer 222 may include silicon oxide and may be formed using an HDPCVD process, as described above. In the method 150, and in some embodiments, since the nitride layer 227 is not formed along sidewalls of the RDL 216, chopping portions of the nitride layer 227 near the corners 319 may not be necessary (or at least is an optional step). Thus, in some examples of the method 150, the various deposition and etching-back cycles of the HDPCVD may be performed at a substantially constant RF power value and pressure. For instance, in some embodiments, the second dielectric layer 222 may be deposited at a low RF power of about 5.7 kW and at a pressure of about 4.5E-3 Torr. In some embodiments, the second dielectric layer 222 may be deposited at an RF power of between about 4.7 kW and about 6.7 kW, and at a pressure in a range of between about 4E-3 Torr and 5E-3 Torr. In some implementations, the second dielectric layer 222 may be formed to a thickness of about 2,700 nm.

Figure 18:
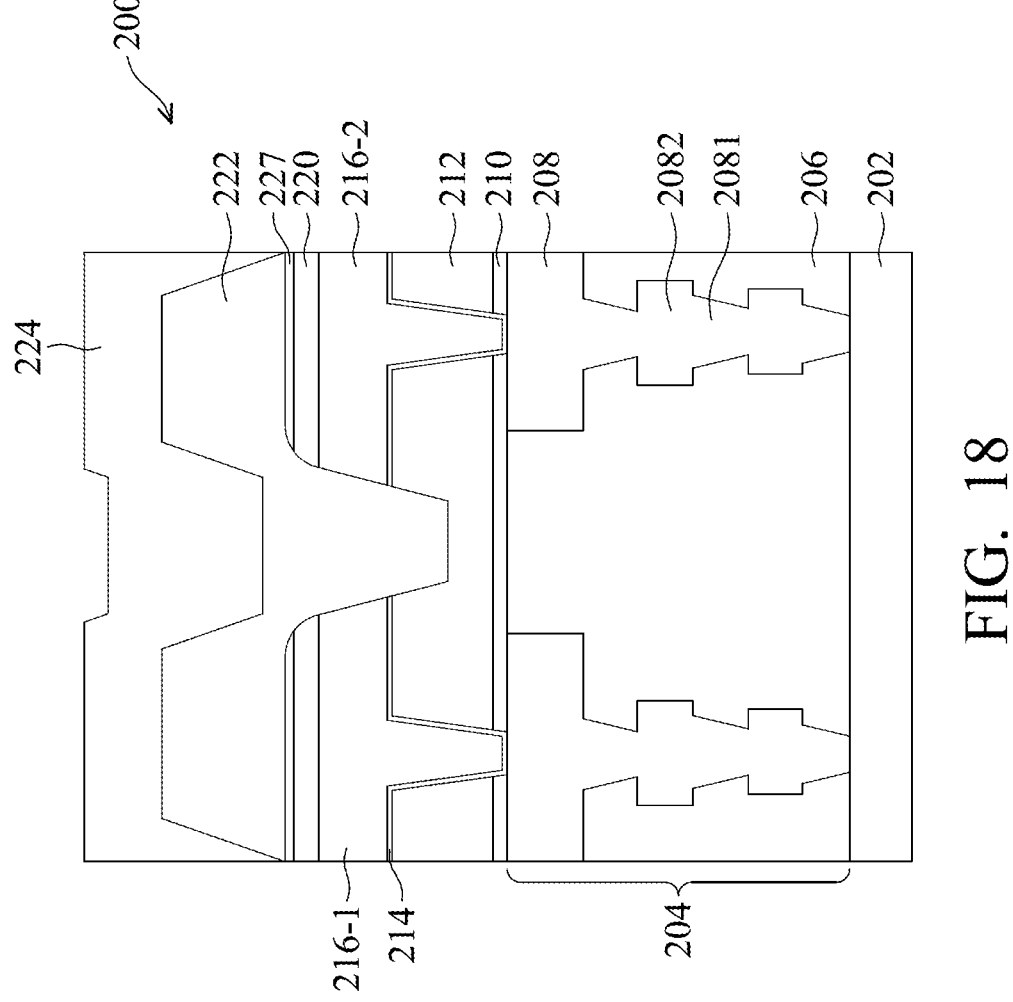
Figure 19:
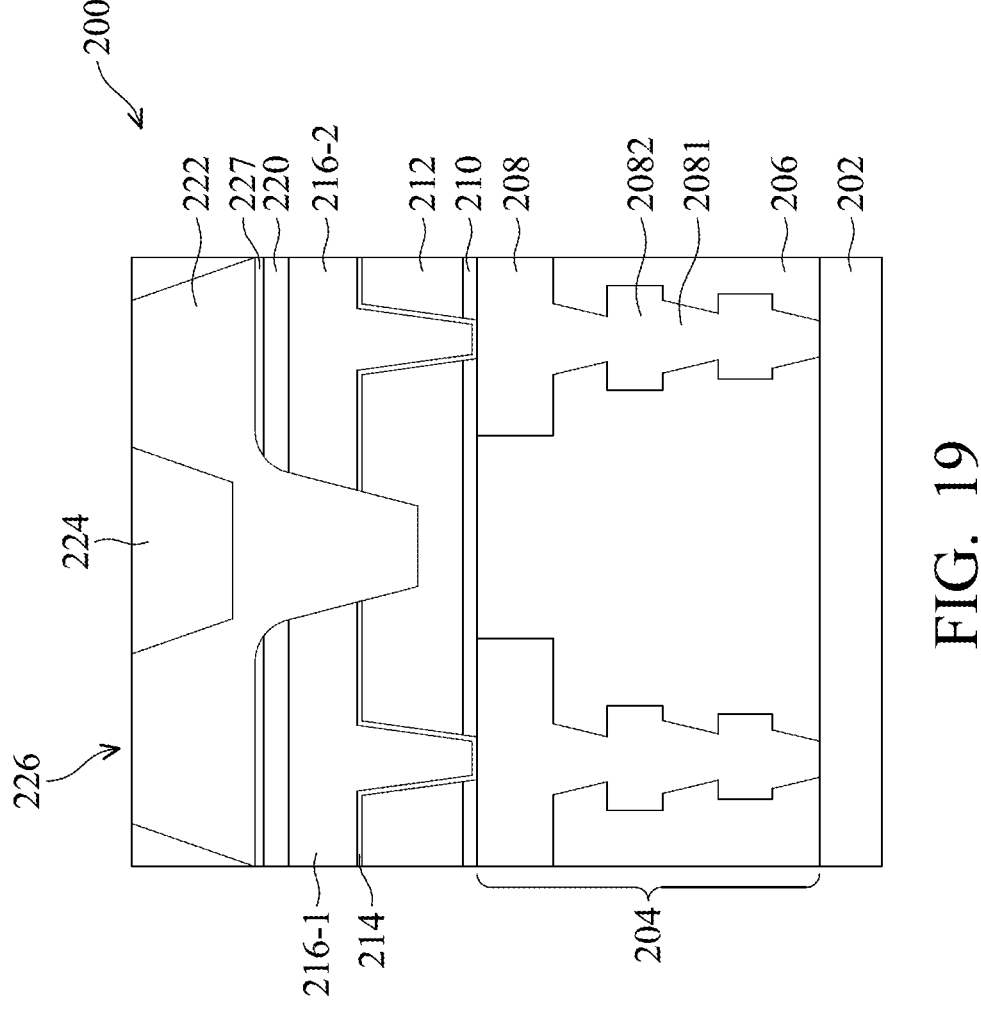

Referring now to FIGS. 14 and 18, the method 150 includes the block 110 where the third dielectric layer 224 is deposited over the second dielectric layer 222. In some embodiments, the third dielectric layer 224 may be substantially the same as described above. Referring to FIGS. 14 and 19, the method 150 also includes the block 112 where a top surface of the workpiece 200 is planarized (e.g., using CMP) to provide the level top surface 226. In some embodiments, and after the CMP process, the total thickness 'T3' of the second dielectric layer 222 may be between about 900 nm and about 1,500 nm. As illustrated in FIG. 19, the level top surface 226 includes a portion of the third dielectric layer 224 and a portion of the second dielectric layer 222.

Figure 20:
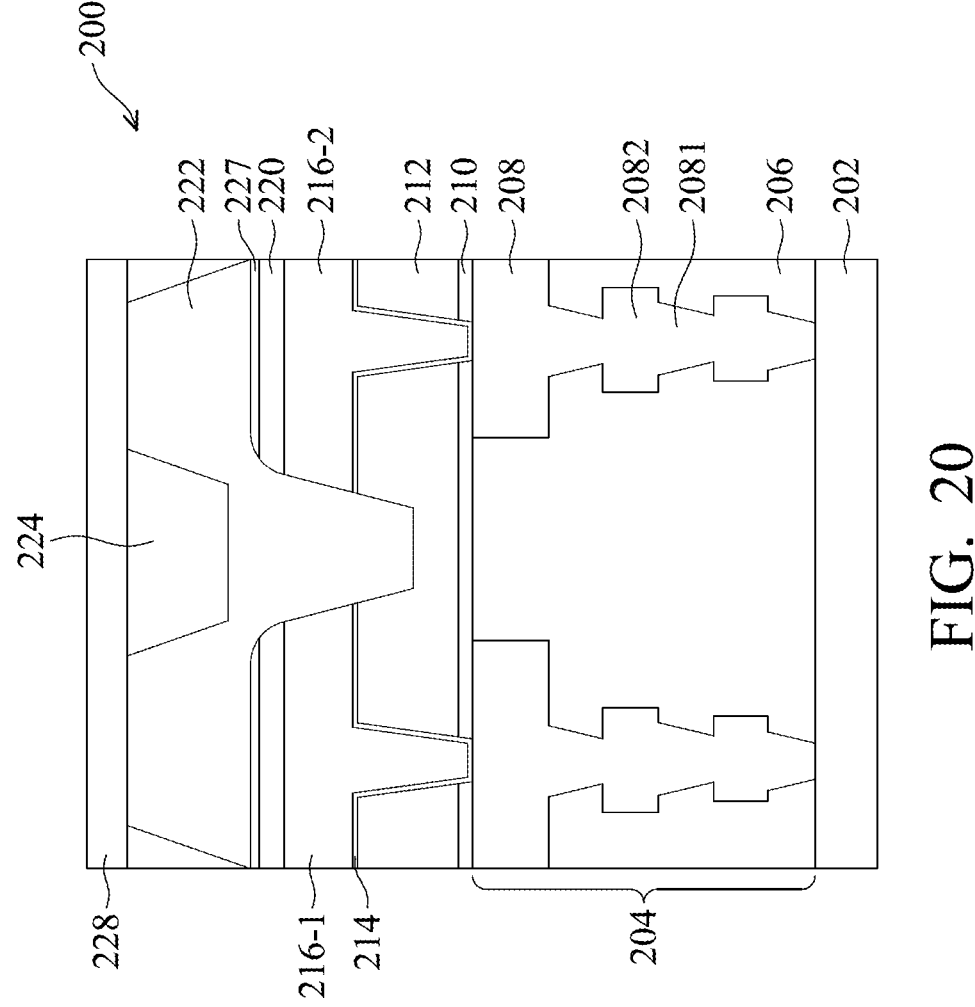
Figure 21:
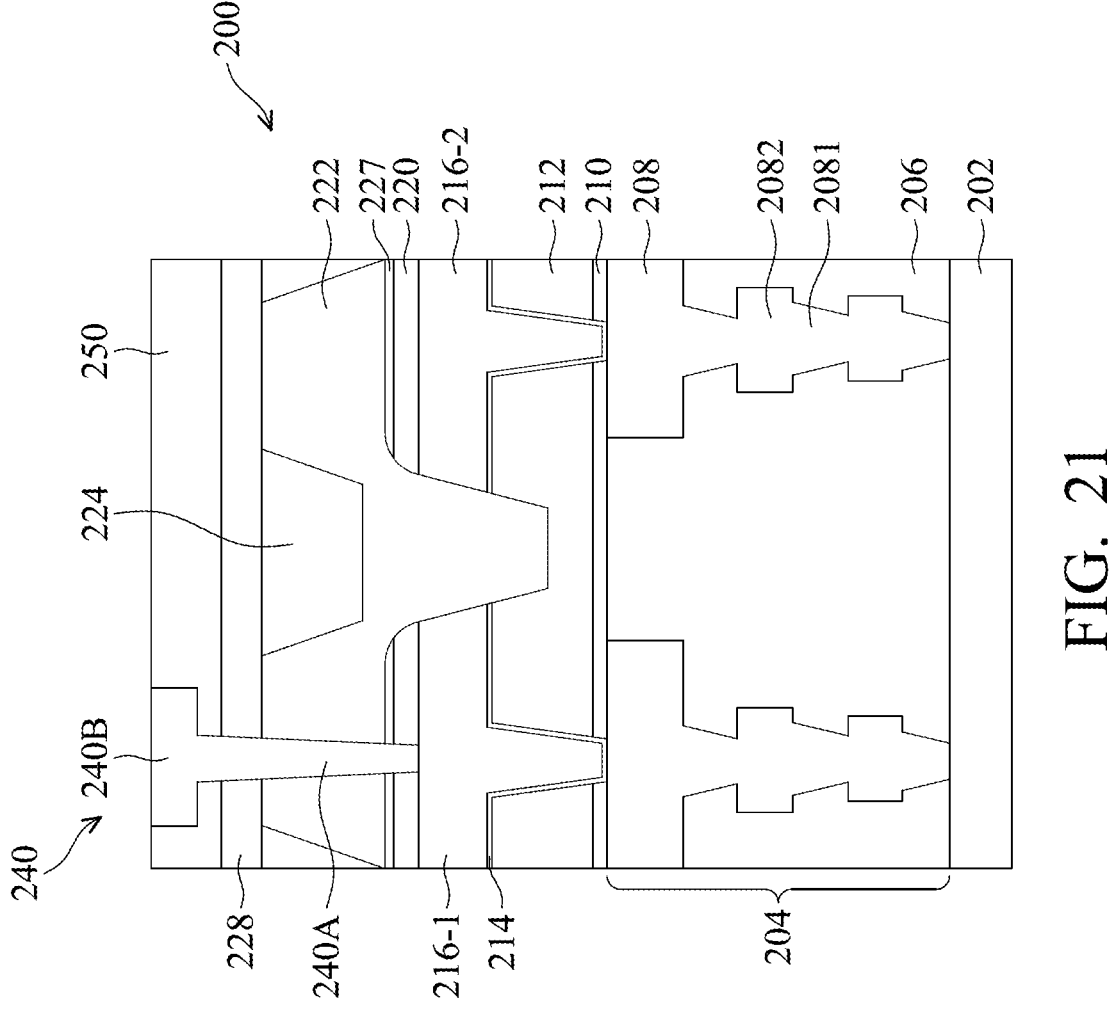

Referring to FIGS. 14 and 20, the method 150 further includes the block 114 where the fourth dielectric layer 228 is deposited over the level top surface 226. In some embodiments, the fourth dielectric layer 228 may be substantially the same as described above. Referring to FIGS. 14 and 21, the method 150 includes the block 116 where the bonding layer 250 is formed over the fourth dielectric layer 228. In some embodiments, the bonding layer 250 may be substantially the same as described above.

Still referring to FIGS. 14 and 21, the method 150 includes the block 118 where contact features, such as the contact feature 240 including the conductive via portion 240A and the conductive line portion 240B, are formed. In some examples, the contact feature 240 may be substantially the same as described above. After formation of the contact feature 240, a CMP process may be performed to remove excess material and planarize a top surface of the workpiece 200.

Figure 22:
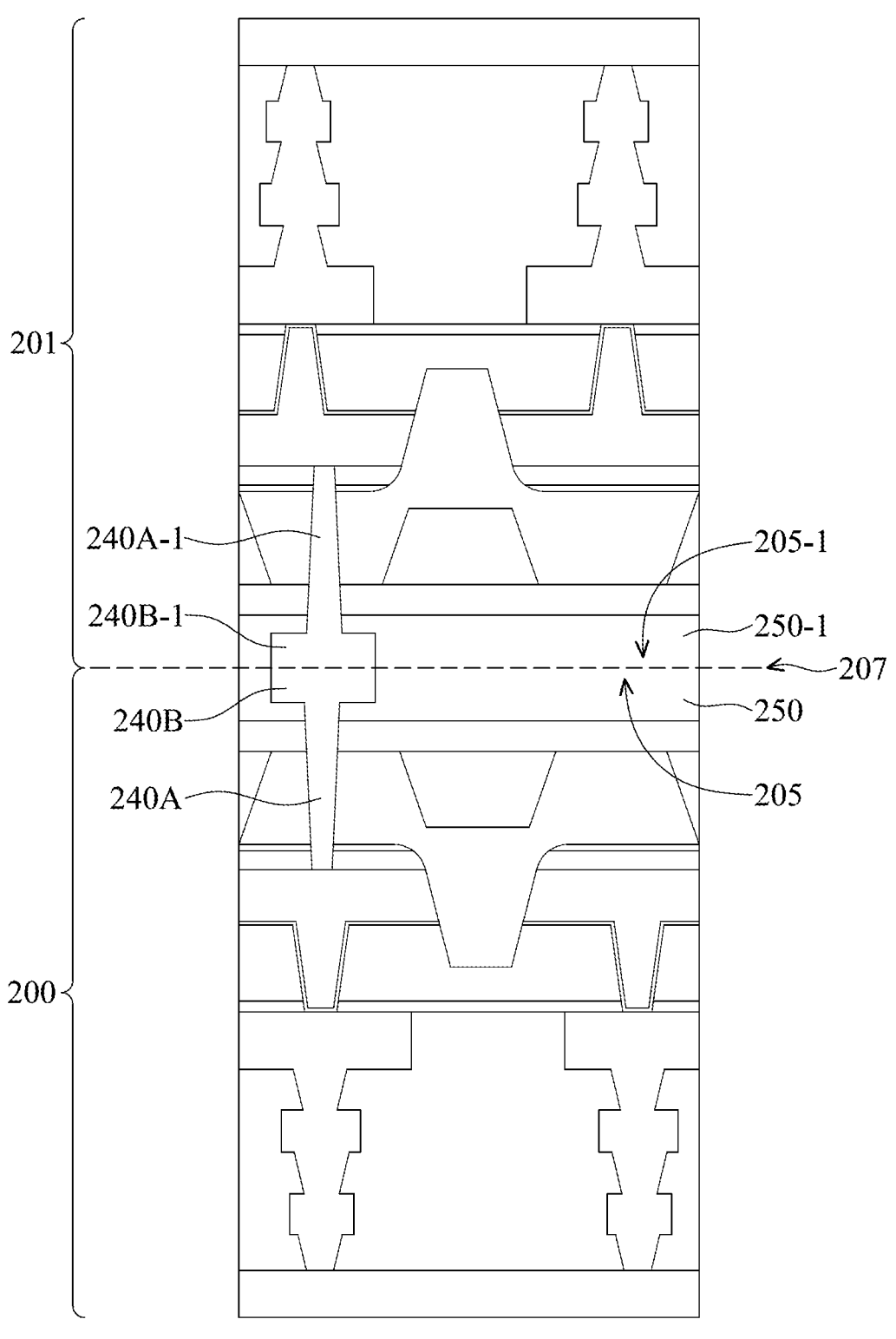

Referring to FIGS. 14 and 22, the method 150 further includes the block 120 where a bonding process is performed. In some cases, the bonding process may be a hybrid bonding process, as previously discussed. In the example of FIG. 22, the workpiece 200 provides the first die 200 (or IC chip), and another workpiece 201 may be similarly processed according to the method 150 (or according to the method 100) to provide the second die 201 (or IC chip) which can be bonded to the first 200 die as part of the bonding process. The bonding process of the block 120 may be performed as discussed above. For instance, a surface activation process may be performed to each of the front side 205 of the first die 200 and the front side 205-1 of the second die 201. Thereafter, the front side 205 of the first die 200 may be brought into contact with the front side 205-1 of the second die 201 along the interface 207 such that the conductive line portion 240B of the first die 200 is substantially aligned with a conductive line portion 240B-1 of the second die 201. An annealing process may then be performed to form an electrical connection between the conductive line portion 240B of the first die 200 and the conductive line portion 240B-1 of the second die 201. It is noted that in accordance with embodiments of the method 150, the release of residual stress from the RDL 216 provided by not forming the nitride layer 227 along sidewalls of the RDL 216 helps to prevent the formation of cracks (e.g., in the second passivation layer 230) during various annealing processes. As a result, device yield and reliability are enhanced, and the process of bonding of the first die 200 to the second die 201 is improved.

With respect to the description provided herein, disclosed are embodiments of a semiconductor device with a multi-layer passivation structure and methods of making the same to address various issues associated with at least some existing implementations. In some embodiments, after patterning an RDL, a corner rounding process may be performed to release stress from RDL corners, where stress may be concentrated. The corner rounding process may include a plurality of etching steps, followed by an Ar bombardment step. In some examples, a main etching step is performed using chlorine gas ($Cl_2$) and boron trichloride gas ($BCl_3$), where a $Cl_2/BCl_3$ gas ratio is less than about 2. The Ar bombardment step may be performed for about 10-30 seconds, depending on a pattern density (PD) of the RDL. In some embodiments, the corner rounding process may be further tuned by modulating the deposition rate of the RDL, after which the etching and Ar bombardment steps are performed. In some examples, a dielectric deposition and etching process may be performed to chop portions of the second passivation layer, which may include a nitride layer, at corners where the second passivation layer is formed over the RDL to further release stress from RDL corners. In a further embodiment, the second passivation layer may be formed such that a portion of the second passivation layer that includes a nitride layer is only formed over a top surface the RDL and not over sidewalls of the RDL. As a result, constraint on the RDL by the nitride layer will be significantly reduced and residual stress from the RDL will be released. In some cases, this may also help to reduce formation of voids in or adjacent to the RDL. By implementation of one or more of the above processes to reduce residual RDL stress, cracks in the passivation layers can be avoided, thereby enhancing device yield and reliability, and improving subsequent die-to-die stacking processes.

Thus, one of the embodiments of the present disclosure described a method that includes receiving a workpiece having a redistribution layer disposed over and electrically coupled to an interconnect structure. In some embodiments, the method further includes patterning the redistribution layer to form a recess between and separating a first conductive feature and a second conductive feature of the redistribution layer, where corners of the first conductive feature and the second conductive feature are defined adjacent to and on either side of the recess. In some examples, the method further includes depositing a first dielectric layer over the first conductive feature, the second conductive feature, and within the recess. In some embodiments, the method further includes depositing a nitride layer over the first dielectric layer. In some examples, the method further includes removing portions of the nitride layer disposed over the corners of the first conductive feature and the second conductive feature.

In another of the embodiments, discussed is a method that includes providing a substrate having a redistribution layer disposed over a multi-layer interconnect (MLI) structure. In some embodiments, the method further includes depositing a nitride layer over the redistribution layer and forming a recess extending through the nitride layer and the redistribution layer. In an example, the recess separates a first portion of the redistribution layer from a second portion of the redistribution layer. In some embodiments, and after forming the recess, the nitride layer remains disposed over top surfaces of the first portion of the redistribution layer and the second portion of the redistribution layer, while sidewall surfaces of the first portion of the redistribution layer and the second portion of the redistribution layer are free of the nitride layer.

In yet another of the embodiments, discussed is a semiconductor device including a redistribution layer having a first conductive feature and a second conductive feature separated by a recess, where corners of the first conductive feature and the second conductive feature are defined adjacent to and on either side of the recess. In some embodiments, the semiconductor device further includes a passivation layer disposed over the redistribution layer and within the recess. In various examples, the semiconductor device further includes a contact feature extending through the passivation layer and electrically coupled to the first conductive feature. In some embodiments, the passivation layer includes a nitride layer having a discontinuity region that is substantially aligned with the corners of the first conductive feature and the second conductive feature. In some cases, a top surface of the first conductive feature defines a first plane, a sidewall of the first conductive feature adjacent to the recess defines a second plane that intersects the first plane, and a rounding of the corner of the first conductive feature is defined at least partly by a distance between the intersection of the first and second planes and a surface of the corner of the first conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:

receiving a workpiece that includes a redistribution layer disposed over and electrically coupled to an interconnect structure;

patterning the redistribution layer to form a recess between and separating a first conductive feature and a second conductive feature of the redistribution layer, wherein corners of the first conductive feature and the second conductive feature are defined adjacent to and on either side of the recess, and wherein the patterning the redistribution layer includes an etching process that provides a rounding of the corners of the first conductive feature and the second conductive feature;

depositing a first dielectric layer over the first conductive feature, the second conductive feature, and within the recess;

depositing a nitride layer over the first dielectric layer; and removing portions of the nitride layer disposed over the corners of the first conductive feature and the second conductive feature.

2. The method of claim 1, wherein the etching process includes a first etching step and a second etching step, wherein the first etching step is performed using a first $Cl_2/BCl_3$ gas ratio, and wherein the second etching step is performed using a second $Cl_2/BCl_3$ gas ratio different than the first $Cl_2/BCl_3$ gas ratio.

3. The method of claim 2, wherein the first $Cl_2/BCl_3$ gas ratio is less than about 2, and wherein the second $Cl_2/BCl_3$ gas ratio is in a range between about 2 and about 3.

4. The method of claim 1, further comprising:

after the patterning the redistribution layer and prior to depositing the first dielectric layer, performing an argon ion bombardment step primarily directed at the corners of the first conductive feature and the second conductive feature to provide an additional rounding of the corners of the first conductive feature and the second conductive feature.

5. The method of claim 4, wherein the argon ion bombardment is performed for a duration of time that is determined based on a pattern density of the redistribution layer.

6. The method of claim 1, wherein the removing the portions of the nitride layer disposed over the corners of the first conductive feature and the second conductive feature is performed as part of depositing a second dielectric layer over the nitride layer.

7. The method of claim 6, wherein the depositing the second dielectric layer includes depositing the second dielectric layer using a high-density plasma chemical vapor deposition (HDPCVD) process.

8. The method of claim 7, wherein the HDPCVD process includes alternating deposition and etching-back cycles performed at different bias values and at different pressure.

9. The method of claim 6, wherein the first dielectric layer and the second dielectric layer are deposited using different deposition techniques.

10. The method of claim 1, wherein the depositing the first dielectric layer forms overhang regions at the corners of the first conductive feature and the second conductive feature due to an accumulation of the first dielectric layer.

11. A method, comprising:

providing a substrate including a redistribution layer disposed over a multi-layer interconnect (MLI) structure;

depositing a nitride layer over the redistribution layer; and forming a recess extending through the nitride layer and the redistribution layer, wherein the recess separates a first portion of the redistribution layer from a second portion of the redistribution layer, and wherein the forming the recess includes an etching process that provides a rounding of a corner of at least one of the first portion of the redistribution layer and the second portion of the redistribution layer on either side of the recess;

wherein after forming the recess, the nitride layer remains disposed over top surfaces of the first portion of the redistribution layer and the second portion of the redistribution layer, while sidewall surfaces of the first portion of the redistribution layer and the second portion of the redistribution layer are free of the nitride layer.

12. The method of claim 11, further comprising:

prior to depositing the nitride layer, depositing a first dielectric layer over the redistribution layer;

depositing the nitride layer over the first dielectric layer; and forming the recess extending through the nitride layer, the first dielectric layer, and the redistribution layer.

13. The method of claim 11, wherein the forming the recess includes the etching process that further provides the rounding of corners of both the first portion of the redistribution layer and the second portion of the redistribution layer on either side of the recess.

14. The method of claim 11, wherein the etching process includes a first etching step and a second etching step, wherein the first etching step is performed using a first $Cl_2/BCl_3$ gas ratio, and wherein the second etching step is performed using a second $Cl_2/BCl_3$ gas ratio different than the first $Cl_2/BCl_3$ gas ratio.

15. The method of claim 14, wherein the first $Cl_2/BCl_3$ gas ratio is less than the second $Cl_2/BCl_3$ gas ratio.

16. The method of claim 13, further comprising:

after forming the recess, performing an argon ion bombardment step primarily directed at the corners of the first portion of the redistribution layer and the second portion of the redistribution layer to provide an additional rounding of the corners of the first portion of the redistribution layer and the second portion of the redistribution layer.

17. The method of claim 16, wherein the argon ion bombardment is performed for a duration of time that is determined based on a pattern density of the redistribution layer.

18. A semiconductor device, comprising:

a redistribution layer including a first conductive feature and a second conductive feature separated by a recess, wherein corners of the first conductive feature and the second conductive feature are defined adjacent to and on either side of the recess;

a first passivation layer disposed over the redistribution layer and within the recess; and a contact feature extending through the first passivation layer and electrically coupled to the first conductive feature;

wherein the first passivation layer includes a nitride layer having a discontinuity region that is substantially aligned with the corners of the first conductive feature and the second conductive feature, wherein the first passivation layer further includes a first dielectric layer interposing the redistribution layer and the nitride layer along upper sidewall portions of the recess and along top surfaces of the first and second conductive features, and wherein the first dielectric layer further interposes a second passivation layer underlying the redistribution layer and the nitride layer along lower sidewall portions of the recess and along a bottom surface of the recess; and wherein a top surface of the first conductive feature defines a first plane, wherein a sidewall of the first conductive feature adjacent to the recess defines a second plane that intersects the first plane, and wherein a rounding of the corner of the first conductive feature is defined at least partly by a distance between the intersection of the first and second planes and a surface of the corner of the first conductive feature.

19. The semiconductor device of claim 18, wherein the first passivation layer further includes a second dielectric layer disposed over the nitride layer.

20. The semiconductor device of claim 19, wherein the first dielectric layer and the second dielectric layer are formed of different materials.

* * * * *